United States Patent
Kim et al.

(10) Patent No.: US 10,310,536 B2
(45) Date of Patent: Jun. 4, 2019

(54) SEMICONDUCTOR DEVICE HAVING A MISMATCH DETECTION AND CORRECTION CIRCUIT

(71) Applicant: SAMSUNG ELECTRONICS CO., LTD., Suwon-si, Gyeonggi-Do (KR)

(72) Inventors: Joo-Seong Kim, Seoul (KR); Sang-Ho Kim, Suwon-si (KR); Kwang-Ho Kim, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 425 days.

(21) Appl. No.: 15/166,392

(22) Filed: May 27, 2016

(65) Prior Publication Data

US 2017/0023966 A1    Jan. 26, 2017

(30) Foreign Application Priority Data

Jul. 23, 2015    (KR) .................. 10-2015-0104355

(51) Int. Cl.
| | | |
|---|---|---|
| *G01K 7/00* | (2006.01) | |
| *G05F 3/24* | (2006.01) | |
| *G01R 31/28* | (2006.01) | |
| *G01K 15/00* | (2006.01) | |
| *G05F 3/26* | (2006.01) | |
| *G01K 7/01* | (2006.01) | |

(52) U.S. Cl.
CPC .............. *G05F 3/245* (2013.01); *G01K 7/01* (2013.01); *G01K 15/005* (2013.01); *G01R 31/2851* (2013.01); *G05F 3/262* (2013.01)

(58) Field of Classification Search
USPC .............................. 374/1, 100, 178; 327/513
See application file for complete search history.

(56) References Cited

U.S. PATENT DOCUMENTS

| | | | |
|---|---|---|---|
| 5,739,681 | A | 4/1998 | Allman |
| 5,892,409 | A | 4/1999 | Boerstler |
| 5,903,012 | A | 5/1999 | Boerstler |
| 6,124,143 | A | 9/2000 | Sugasawara |
| 6,556,068 | B2 | 4/2003 | Forbes et al. |
| 6,612,737 | B1 * | 9/2003 | Lobban .................. G01K 1/026 374/1 |
| 6,853,177 | B2 | 2/2005 | Shibayama et al. |
| 7,155,360 | B2 | 12/2006 | Shinohara |
| 7,224,176 | B2 | 5/2007 | Ryu et al. |
| 7,422,366 | B1 * | 9/2008 | Kim .................... G01R 31/2621 324/762.08 |
| 7,495,465 | B2 | 2/2009 | Khan et al. |
| 7,667,527 | B2 | 2/2010 | Clark, Jr. et al. |
| 7,843,205 | B2 | 11/2010 | Burns et al. |
| 8,392,132 | B2 | 3/2013 | Lin et al. |

(Continued)

*Primary Examiner* — Mirellys Jagan
(74) *Attorney, Agent, or Firm* — F. Chau & Associates, LLC

(57) ABSTRACT

A semiconductor device includes: an integrated circuit (IC) including an internal circuit; and a mismatch detection and correction circuit connected to the internal circuit of the IC, the mismatch detection and correction circuit configured to detect a process mismatch and correct an error in the internal circuit caused by the process mismatch using a current difference between a first current and a second current based on a charged voltage of a capacitor.

10 Claims, 25 Drawing Sheets

(56) References Cited

U.S. PATENT DOCUMENTS

| | | | |
|---|---|---|---|
| 2006/0066386 A1* | 3/2006 | Hong | G11C 11/406 327/513 |
| 2009/0296780 A1* | 12/2009 | Lee | G01K 7/01 374/178 |
| 2010/0066434 A1* | 3/2010 | Liao | G05F 3/245 327/513 |
| 2010/0321094 A1 | 12/2010 | Luo et al. | |
| 2014/0300408 A1 | 10/2014 | Miyatake et al. | |
| 2015/0003490 A1* | 1/2015 | Ash | G01K 15/005 374/1 |
| 2016/0179113 A1* | 6/2016 | Taigor | G11C 16/06 327/513 |

* cited by examiner

<Sampling Phase>

<Comparison Phase>

<Sampling Phase>

<Comparison Phase>

SEMICONDUCTOR DEVICE HAVING A MISMATCH DETECTION AND CORRECTION CIRCUIT

CROSS-REFERENCE TO RELATED APPLICATION

This application claims priority under 35 U.S.C. § 119 to Korean Patent Application No. 10-2015-0104355, filed on Jul. 23, 2015, in the Korean Intellectual Property Office, the disclosure of which is incorporated by reference herein in its entirety.

TECHNICAL FIELD

The inventive concept relates to a semiconductor device, and more particularly, to a mismatch detection and correction circuit (MDCC), and a semiconductor device including the MDCC.

DISCUSSION OF RELATED ART

In semiconductor processing, variations in the manufacture thereof frequently occur. For example, a threshold voltage or driving current of a transistor may differ from a designed value due to discrepancies between thicknesses or ion-doped concentrations of oxide films. This may be referred to as a process mismatch. The process mismatch worsens as a micro-fabrication process continues. Such a mismatch may cause a temperate sensor to malfunction.

SUMMARY

According to an exemplary embodiment of the inventive concept, there is provided a semiconductor device including an integrated circuit (IC) including an internal circuit, and a mismatch detection and correction circuit (MDCC) connected to the IC. The MDCC may detect a process mismatch and correct an error in the internal circuit caused by the process mismatch.

In an exemplary embodiment of the inventive concept, the MDCC may detect a threshold voltage ($V_{TH}$) mismatch and a source-drain conductance ($G_{DS}$) mismatch of a transistor of the IC.

In an exemplary embodiment of the inventive concept, the MDCC may include a first transistor connected between a power supply and a first terminal of a first switch, a capacitor connected between the power supply and a first terminal of a second switch, a second transistor connected between the power supply and a first terminal of a third switch, and a third transistor connected between second terminals of the first, second and third switches and a ground voltage. The third transistor may be controlled by a bias voltage. Gates of the first and second transistors may be connected to a connection node between the capacitor and the second switch.

In an exemplary embodiment of the inventive concept, when the first and second switches are turned on and the third switch is turned off, a first current may be supplied to the first transistor. When the first and second switches are turned off and the third switch is turned on, a second current may be supplied to the second transistor, and a current difference between the first current and the second current may be detected as a threshold voltage ($V_{TH}$) mismatch of a transistor of the IC.

In an exemplary embodiment of the inventive concept, the bias voltage may be adjusted such that the first current is equal to the second current, and an error caused by the threshold voltage ($V_{TH}$) mismatch of the transistor of the IC may be corrected by using a recovery current supplied to the third transistor in response to the adjusted bias voltage.

In an exemplary embodiment of the inventive concept, the MDCC may include a first transistor connected between a power supply and a first node, a second transistor connected between the power supply and a second node, a third transistor connected between the first node and a first terminal of a first switch, a capacitor connected between the power supply and a first terminal of a second switch, a fourth transistor connected between the second node and a first terminal of a third switch, and a fifth transistor connected between second terminals of the first, second and third switches and a ground voltage. The fifth transistor is controlled by a first bias voltage. Gates of the first and second transistors may be connected to a connection node between the capacitor and the second switch, and gates of the third and fourth transistors may be connected to second and third bias voltages.

In an exemplary embodiment of the inventive concept, the second and third bias voltages connected to the gates of the third and fourth transistors may be equal to one another. When the first and second switches are turned on and the third switch is off, a first current may be supplied to the first transistor. When the first and second switches are turned off and the third switch is turned on, a second current may be supplied to the second transistor, and a threshold voltage ($V_{TH}$) mismatch of the transistor may be determined by a current difference between the first current and the second current.

In an exemplary embodiment of the inventive concept, the first bias voltage may be adjusted such that the first current is equal to the second current, and an error caused by the threshold voltage ($V_{TH}$) mismatch of the transistor of the IC may be corrected by using a recovery current added to the fifth transistor in response to the adjusted first bias voltage.

In an exemplary embodiment of the inventive concept, when the second bias voltage is the ground voltage, a first current may be supplied to the first transistor due to a first voltage difference between a source and a drain of the first transistor. The third bias voltage may be different from the second bias voltage, and when the third bias voltage is applied to the fourth transistor, a second current may be supplied to the second transistor due to a second voltage difference between a source and a drain of the second transistor. The third bias voltage may be varied such that the second voltage difference is larger than the first voltage difference, and a source-drain conductance ($G_{DS}$) mismatch of the transistor of the IC may be determined by a current difference between the first current and the second current.

In an exemplary embodiment of the inventive concept, the first bias voltage may be varied such that the first current is equal to the second current, and the error caused by the source-drain conductance (GDS) mismatch of the transistor may be corrected in response to the adjusted first bias voltage.

According to an exemplary embodiment of the inventive concept, there is provided a temperature sensor including a reference voltage generating circuit connected to a first MDCC. The reference voltage generating circuit may generate first and second reference voltages, that are constant irrespective of temperature. A first voltage generating circuit may generate, based on the second reference voltage, a first voltage in proportional to temperature. An analog-to-digital converter (ADC) may generate a digital temperature signal based on the first reference voltage and the first voltage. The first MDCC may detect a threshold voltage ($V_{TH}$) mismatch and a source-drain conductance ($G_{DS}$) mismatch of a transistor of the reference voltage generating circuit and correct an error in the reference voltage generating circuit caused by the threshold voltage ($V_{TH}$) mismatch and a source-drain conductance ($G_{DS}$) mismatch.

In an exemplary embodiment of the inventive concept, the ADC may include a comparator that may compare the first voltage with a second voltage provided by a digital-to-analog converter (DAC). A control logic circuit may generate a first control code based on a comparison of the comparator. The DAC may generate the second voltage based on the first reference voltage in response to the first control code. A cycle includes comparing the first voltage with the second voltage until the first voltage is equal to the second voltage, generating the first control code based on the comparison of the first voltage with the second voltage, and varying the level of the second voltage based on the generated first control code.

In an exemplary embodiment of the inventive concept, the comparator may be connected to a second MDCC. The second MDCC may detect a threshold voltage ($V_{TH}$) mismatch and a source-drain conductance ($G_{DS}$) mismatch of a transistor of the comparator and corrects an error in the comparator caused by the threshold voltage ($V_{TH}$) mismatch and a source-drain conductance ($G_{DS}$) mismatch.

In an exemplary embodiment of the inventive concept, the first MDCC circuit may include a first transistor connected between a power supply and a first terminal of a first switch, a capacitor connected between the power supply and a first terminal of a second switch, a second transistor connected between the power supply and a first terminal of a third switch, and a third transistor connected between second terminals of the first, second and third switches and a ground voltage. The third transistor may be controlled by a bias voltage. Gates of the first and second transistors are connected to a connection node between the capacitor and the second switch.

In an exemplary embodiment of the inventive concept, the first MDCC may include a first transistor connected between a power supply and a first node, a second transistor connected between the power supply and a second node, a third transistor connected between the power supply and a first terminal of a second switch, a capacitor connected between the second node and a first terminal of a third switch, a fourth transistor connected between the second node and a first terminal of a third switch, and a fifth transistor connected between second terminals of the first, second, and third switches and a ground voltage. The fifth transistor may be controlled by a first bias voltage. Gates of the first and second transistors may be connected to a connection node between the capacitor and the second switch, and gates of the third and fourth transistors may be connected to second and third bias voltages.

According to an exemplary embodiment of the inventive concept, there is provided a storage device including a controller and a storage unit. The controller connected to a first circuit. The storage unit connected to the controller. The first circuit may detect at least one mismatch of a transistor of the controller and correct an error in the controller caused by the mismatch.

In an exemplary embodiment of the inventive concept, the at least one mismatch may include a threshold voltage mismatch or a source-drain conductance mismatch of the transistor In an exemplary embodiment of the inventive concept, the first circuit may include a first transistor connected between a power supply and a first terminal of a first switch, a capacitor connected between the power supply and a first terminal of a second switch, a second transistor connected between the power supply and a first terminal of a third switch, and a third transistor connected between second terminals of the first, second and third switches and a ground voltage. The third transistor may be controlled by a bias voltage. Gates of the first and second transistors may be connected to a connection node between the capacitor and the second switch.

In an exemplary embodiment of the inventive concept, the first circuit may include a first transistor connected between a power supply voltage and a first node, a second transistor connected between the power supply voltage and a second node, a third transistor connected between the first node and a first terminal of a first switch, a capacitor connected between the power supply voltage and a first terminal of a second switch, a fourth transistor connected between the second node and a first terminal of a third switch, and a fifth transistor connected between second terminals of the first, second and third switches and a ground voltage. The fifth transistor is controlled by a first bias voltage. Gates of the first and second transistors may be connected to a connection node between the capacitor and the second switch, and gates of the third and fourth transistors may be connected to second and third bias voltages.

In an exemplary embodiment of the inventive concept, the controller may include a processor, a flash memory interface, a memory and a host interface. The processor may control the storage device in response to a control command received from a host via an internal bus and to store data corresponding to the control command in the memory. The flash interface may receive data from the storage unit over a plurality of channels. A memory may store a program code for controlling the processor and may store data transmitted and received between the host and the processor. A host interface may transmit the control command or data output by the host to the processor via an internal bus.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
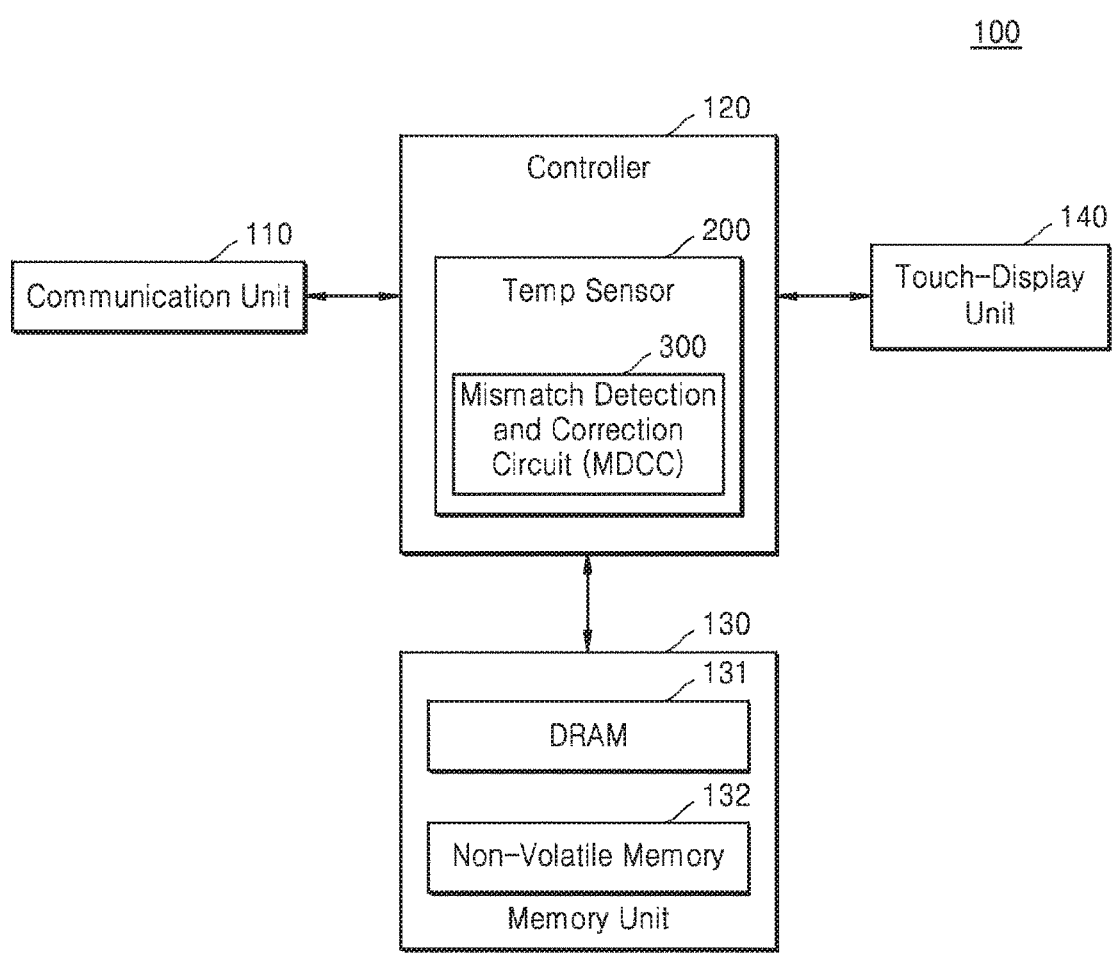
FIG. 1 is a diagram of a mobile device including a temperature sensor including a mismatch detection and correction circuit (MDCC) according to an exemplary embodiment of the inventive concept.

Exemplary embodiments of the present inventive concept will now be described hereinafter with reference to the accompanying drawings.

The inventive concept may, however, be embodied in many alternative forms and should not be construed as limited to the embodiments set forth herein. Like reference numerals may refer to like elements throughout the application.

As used herein, the singular forms "a", "an" and "the" are intended to include the plural forms as well, unless the context clearly indicates otherwise.

FIG. 1 is a diagram of a mobile device 100 including a temperature sensor 200 according to an exemplary embodiment of the inventive concept. The temperature sensor 200 includes a mismatch detection and correction circuit (MDCC) 300.

Referring to FIG. 1, the mobile device 100 may be, for example, a portable terminal, such as a mobile phone, tablet or laptop. For example, a Galaxy S or iPhone. The mobile device 100 may include a communication unit 110, a controller 120, a memory unit 130, and a touch-display unit 140.

The communication unit 110 may transmit and receive a wireless signal of data, which is input or output via an antenna, or transmit and receive data of a computer system connected via a universal serial bus (USB) port. The controller 120 may control and process the overall operation of the mobile device 100. The memory unit 130 may store various programs and data for the overall operation of the mobile device 100. The memory unit 130 may include at least one dynamic random access memory (DRAM) 131 and at least one non-volatile memory 132.

The DRAM 131 may temporarily store data processed by the mobile device 100 under the control of the controller 120. The non-volatile memory 132 may include at least one flash memory and function to download a boot loader and an operating system (OS) of the mobile device 100 and serve as a mass storage for the mobile device 100. The non-volatile memory 132 may be an embedded memory card using a secure digital/multi-media card (SD/MMC) interface protocol. The non-volatile memory 132 may receive data stored in the DRAM 131 via the SD/MMC interface.

The touch-display unit 140 may include a display panel configured to display status information, numbers, and letters, which may occur during an operation of the mobile device 100. The display panel may display a list of contents stored in the non-volatile memory 132 and version information regarding the contents under the control of the controller 120. The display panel may be embodied by any flat panel display (FPD) technology, such as an organic light emitting diode (OLED) panel including a plurality of light emitting diodes (LEDs) and a liquid crystal display (LCD) panel.

The touch-display unit 140 may include a touch screen panel, which may enable a user to promptly and easily manipulate the contents displayed on a screen of the touch-display unit 140. The touch screen panel may include a plurality of touch sensor electrodes, which may include transparent electrodes formed of indium tin oxide (ITO) on a transparent substrate. When a user's finger or pen comes close to or into contact with the touch sensor electrode, the touch screen panel may generate a touch signal based on a variation in capacitance of the touch sensor electrode due to the close contact and output the touch signal to the controller 120.

As the operating speed of the mobile device 100 increases and more components are integrated into the mobile device 100, the mobile device 100 may generate more heat. Managing or monitoring the temperature of the mobile device 100 may prevent the mobile device 100 from entering into thermal runaway and operate stably.

In addition, the DRAM 131 of the memory unit 130 may perform a refresh operation and sense and rewrite data of each memory cell before each cell loses an electric charge due to a leakage current. The leakage current of the DRAM 131 may be reduced at a low temperature and increased at a high temperature. In other words, the leakage current of the DRAM 131 may be dependent on temperature. Power consumption of the DRAM 131 may be reduced by varying a refresh operation such that the DRAM 131 has a long refresh period at low temperatures and a short refresh period at high temperatures.

In the mobile device 100, the controller 120 may include the temperature sensor 200 and detect an inner temperature of the mobile device 100. In an exemplary embodiment of the inventive concept, the temperature sensor 200 may be included in a component (e.g., the communication unit 110, the memory unit 130, or the touch-display unit 140) of the mobile device 100, other than the controller 120. In an exemplary embodiment of the inventive concept, the temperature sensor 200 may be provided as an additional IC in the mobile device 100.

When a process mismatch due to a process variation occurs, the temperature sensor 200 may include the MDCC 300 to enable the temperature sensor 200 to stably operate. A process variation may occur during manufacture of the mobile device 100. The MDCC 300 may detect a threshold voltage ($V_{TH}$) mismatch or a source-drain conductance ($G_{DS}$) mismatch of a transistor due to a process mismatch and correct an error caused by the mismatch for the temperature sensor 200. Thus, if the process mismatch occurs, the temperature sensor 200 may stably generate temperature information of the mobile device 100 and provide the temperature information to the controller 120. The controller 120 may analyze the temperature information provided by the temperature sensor 200 and take appropriate actions.

Figure 2:
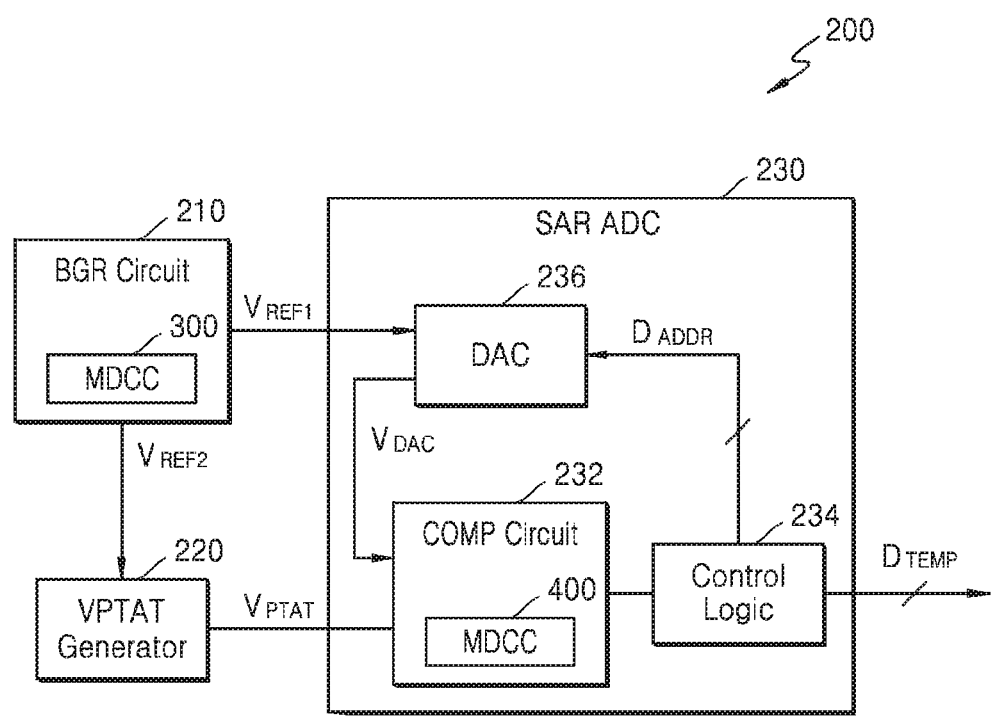
FIG. 2 is a diagram of a temperature sensor including an MDCC according to an exemplary embodiment of the inventive concept.

FIG. 2 is a diagram of a temperature sensor 200 including an MDCC according to an exemplary embodiment of the inventive concept.

Referring to FIG. 2, the temperature sensor 200 may include a reference voltage generating circuit 210, a first voltage generating circuit 220, and an analog-to-digital converter (ADC) 230.

The reference voltage generating circuit 210 may generate first and second reference voltages $V_{REF1}$ and $V_{REF2}$, which are constant irrespective of a temperature. The first and second reference voltages $V_{REF1}$ and $V_{REF2}$ may have different voltage levels, and the first reference voltage $V_{REF1}$ may have a higher voltage level than the second reference voltage $V_{REF2}$.

The first reference voltage $V_{REF1}$ may be provided to the ADC circuit 230, and the second reference voltage $V_{REF2}$ may be provided to the first voltage generating circuit 220. The reference voltage generating circuit 210 may generate the first and second reference voltages $V_{REF1}$ and $V_{REF2}$, which have constant voltage levels irrespective of a variation in temperature, by using a band gap reference (BGR) circuit.

The first voltage generating circuit 220 may generate a first voltage $V_{PTAT}$, which is proportional to a temperature, based on the second reference voltage $V_{REF2}$. The first voltage generating circuit 220 may generate an internal voltage in inverse proportion to a temperature, and generate the first voltage $V_{PTAT}$ by using the second reference voltage $V_{REF2}$ and the internal voltage. The first voltage generating circuit 220 may subtract the internal voltage from the second reference voltage $V_{REF2}$ and generate the first voltage $V_{PTAT}$, which is proportional to a temperature.

The ADC 230 may generate a digital temperature signal $D_{TEMP}$ based on the first reference voltage $V_{REF1}$ and the first voltage $V_{PTAT}$ that is proportional to a temperature. The digital temperature signal $D_{TEMP}$ may include temperature information of the mobile device (refer to 100 in FIG. 1). The ADC 230 may include a comparator 232, a control logic unit 234, e.g., a control logic circuit, and a digital-to-analog conversion (DAC) unit 236.

The comparator 232 may compare the first voltage $V_{PTAT}$ with a second voltage $V_{DAC}$ provided by the DAC unit 236, and output a comparison result to the control logic unit 234. The control logic unit 234 may generate a first control code $D_{ADDR}$ based on the comparison result of the comparator 232 and provide the first control code $D_{ADDR}$ to the DAC unit 236. The DAC unit 236 may generate the second voltage $V_{DAC}$ based on the first reference voltage $V_{REF1}$ in response to the first control code $D_{ADDR}$. The control logic unit 234 may generate the first control code $D_{ADDR}$ to equalize a level of the second voltage $V_{DAC}$ to a level of the first voltage $V_{PTAT}$, and generate a digital temperature signal $D_{TEMP}$ corresponding to the first control code $D_{ADDR}$.

The ADC 230 may repeat an operation that includes comparing the level of the first voltage $V_{PTAT}$ with the level of the second voltage $V_{DAC}$ until the first voltage $V_{PTAT}$ becomes equal to the second voltage $V_{DAC}$, generating the first control code $D_{ADDR}$ based on a comparison result, and varying the level of the second voltage $V_{DAC}$ based on the generated first control code $D_{ADDR}$.

In an exemplary embodiment of the inventive concept, the ADC 230 may estimate a second voltage $V_{DAC}$ to be compared by the comparator 232 based on a comparison result of the comparator 232 by using a successive approximate register (SAR). The ADC 230 may be referred to as an SAR ADC. The SAR ADC 230 may modify a most significant bit (MSB) to low-order bits in a sequential order, internally generating the second voltage $V_{DAC}$. The second voltage $V_{DAC}$ is an approximation of the first voltage $V_{PTAT}$. The SAR ADC 230 may also generate a digital temperature signal $D_{TEMP}$ that is close to the first voltage $V_{PTAT}$.

The temperature sensor 200 may be imprecise due to a process mismatch caused by a process variation, and thus, may not precisely detect a variation in temperature. For example, when malfunctions occur in the reference voltage generating circuit 210 and the comparator 232 occur due to the process mismatch, the temperature sensor 200 may enter an inoperable state. Thus, the temperature sensor 200 may include first and second MDCCs 300 and 400 to detect a mismatch caused by a process variation, correct an error caused by the mismatch, and enable the temperature sensor 200 to stably operate.

The first MDCC 300 may be embedded in the reference voltage generating circuit 210, and the second MDCC 400 may be embedded in the comparator 232. The first MDCC 300 may have the same configuration as the second MDCC 400. The first and second MDCCs 300 and 400 may perform an operation of detecting and correcting a threshold voltage ($V_{TH}$) mismatch and a source-drain conductance ($G_{DS}$) mismatch of a transistor.

Hereinafter, various exemplary embodiments of the MDCC 300 will be described in further detail.

Figure 3:
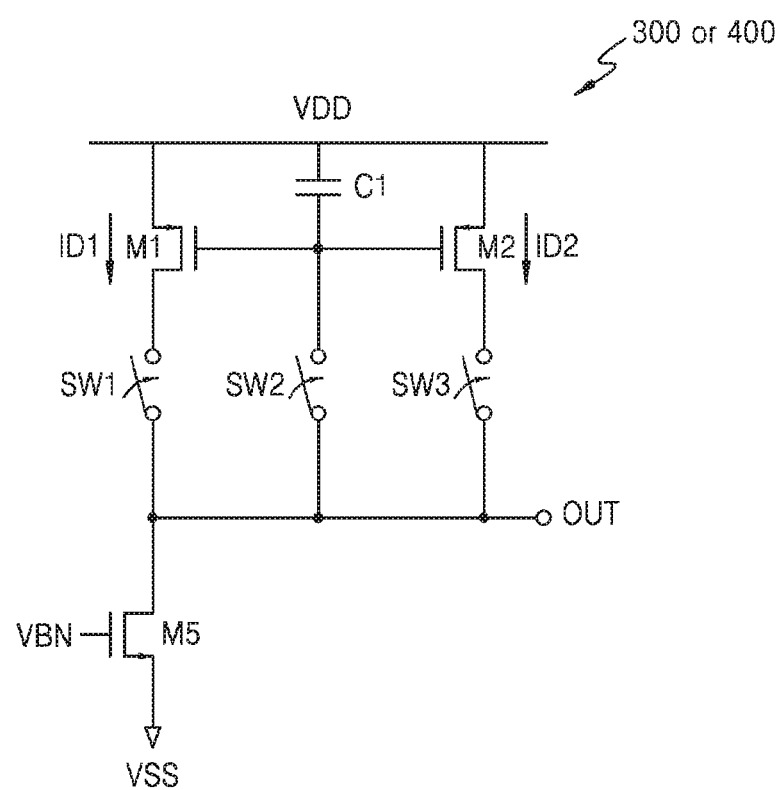
FIG. 3 is a circuit diagram of a first example of an MDCC according to an exemplary embodiment of the inventive concept.

FIG. 3 is a circuit diagram of an MDCC according to an exemplary embodiment of the inventive concept.

Referring to FIG. 3, an MDCC 300 or 400 may compare a first current ID1, which is supplied in a sampling phase, with a second current ID2, which is supplied in a comparison phase, and detect a threshold voltage ($V_{TH}$) mismatch. The MDCC 300 may include first and second monitoring transistors M1 and M2, a sampling capacitor C1, first to third switches SW1, SW2, and SW3, and a current source M5.

The first monitoring transistor M1 may be connected between a power supply voltage VDD and the first switch SW1, the sampling capacitor C1 may be connected between the power supply voltage VDD and the second switch SW2, and the second monitoring transistor M2 may be connected between the power supply voltage VDD and the third switch SW3. Gates of the first and second monitoring transistors M1 and M2 may be connected in common to a connection node between the sampling capacitor C1 and the second switch SW2. The first and second monitoring transistors M1 and M2, each of which includes a PMOS transistor, may be designed to have the same size.

The first to third switches SW1, SW2, and SW3 may be connected in common to an output node OUT. A current source M5 may be connected between the output node OUT and a ground voltage VSS. The current source M5 may include an NMOS transistor, which is controlled in response to a bias voltage VBN. An amount of current transmitted through the current source M5 may be determined by the bias voltage VBN.

The MDCC 300 or 400 may compare the first current ID1, which is supplied to the first monitoring transistor M1, with the second current ID2, which is supplied to the second monitoring transistor M2, monitor a voltage level of the output node OUT based on a comparison result, and detect a threshold voltage ($V_{TH}$) mismatch of a transistor.

Operations of the MDCC 300 configured to detect the threshold voltage ($V_{TH}$) mismatch of the transistor will be described in detail with reference to FIGS. 4A to 4C.

FIGS. 4A to 4D diagram the operation of the MDCC of FIG. 3.

Figure 4A:
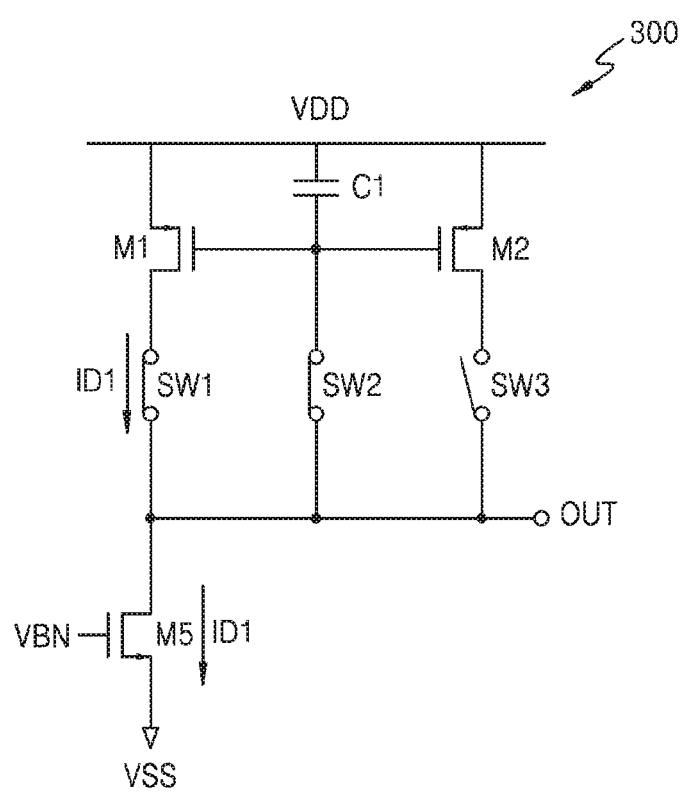
FIGS. 4A to 4D are diagrams of operations of the MDCC of FIG. 3.

Referring to FIG. 4A, in a sampling phase, when the first and second switches SW1 and SW2 are turned on and the third switch SW3 is turned off, a gate and drain of the first monitoring transistor M1 may be connected. The first current ID1 may be supplied to the first monitoring transistor M1 according to a voltage charged in the sampling capacitor C1 connected to the gate of the first monitoring transistor M1. The bias voltage VBN may be set such that an amount of current corresponding to the first current ID1 flows through the current source M5.

Figure 4B:
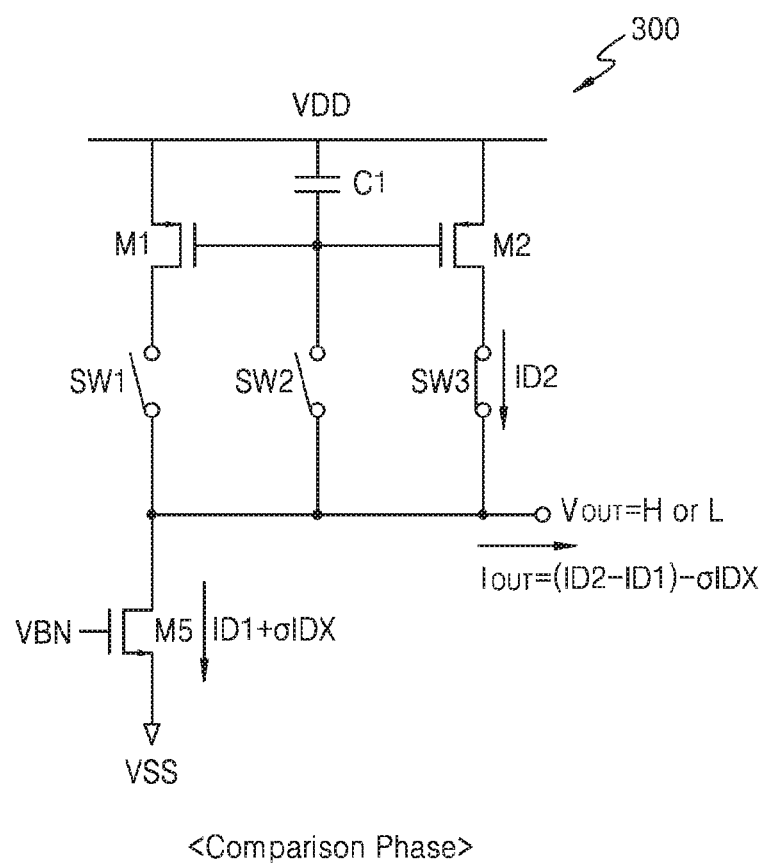
Figure 4C:
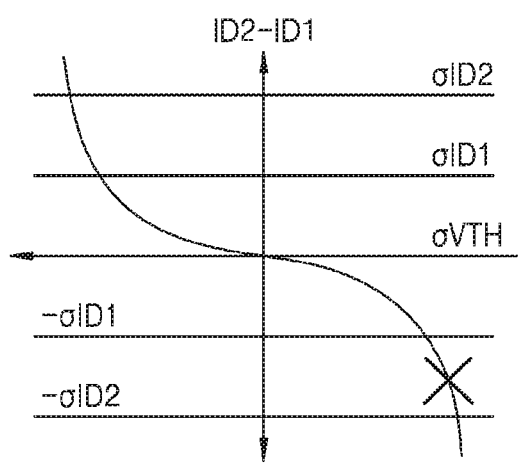

Referring to FIG. 4B, in a comparison phase, when the first and second switches SW1 and SW2 are turned off and the third switch SW3 is turned on, the second current ID2 may be supplied to the second monitoring transistor M2 according to a voltage charged in the sampling capacitor C1 connected to the gate of the second monitoring transistor M2. The second current ID2 may flow through the current source M5 to the ground voltage VSS. In this case, the current source M5 may be set to supply an amount of current corresponding to the first current ID1 in the sampling phase.

In the comparison phase, the second current ID2 may be compared with the first current ID1. For example, when the second current ID2 is smaller than the first current ID1, an output node voltage $V_{OUT}$ may be generated at a low logic level 'L'. This may indicate that a threshold voltage $V_{TH2}$ of the second monitoring transistor M2 is higher than a threshold voltage $V_{TH1}$ of the first monitoring transistor M1.

A mismatch between the threshold voltage $V_{TH2}$ of the second monitoring transistor M2 and the threshold voltage $V_{TH1}$ of the first monitoring transistor M1 may be confirmed based on some degree to which the second current ID2 is less than the first current ID1. For example, a recovery current σ IDX may be subtracted from the first current ID1 flowing through the current source M5 so that the first current ID1 of the current source M5 may be equal to the second current ID2. The recovery current σ IDX may indicate a current difference between the second current ID2 and the first current ID1. As shown in FIG. 4C, the recovery current σ IDX subtracted from the first current ID1 flowing through the current source M5 may be controlled, for example, in the range of −σ D2 and −σ D1. The current source M5 may reduce the bias voltage VBN and adjust a current (ID1−σ IDX) flowing through the current source M5.

In the comparison phase, when the second current ID2 is larger than the first current ID1, the output node voltage $V_{OUT}$ may be generated at a high logic level 'H'. This may indicate that the threshold voltage $V_{TH2}$ of the second monitoring transistor M2 is lower than the threshold voltage $V_{TH1}$ of the first monitoring transistor M1.

Figure 4D:
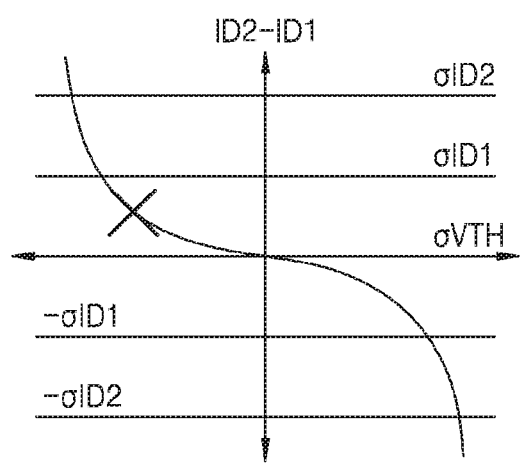

A mismatch between the threshold voltage $V_{TH2}$ of the second monitoring transistor M2 and the threshold voltage $V_{TH1}$ of the first monitoring transistor M1 may be confirmed based on some degree to which the second current ID2 is more than the first current ID1. For example, a recovery current σ IDX may be added to the current ID1 supplied to the current source M5 such that the first current ID1 of the current source M5 is equal to the second current ID2. The recovery current σ IDX added to the current source M5 may be controlled, for example, in the range between 0 and σ ID1 as shown in FIG. 4D. The current source M5 may increase the bias voltage VBN and adjust a current ID1+σ IDX flowing through the current source M5.

The MDCC 300 may adjust the current ID1+σ IDX flowing through the current source M5 and detect a difference between the threshold voltage $V_{TH1}$ of the first monitoring transistor M1 and the threshold voltage $V_{TH2}$ of the second monitoring transistor M2. The MDCC 300 may vary the bias voltage VBN and adjust the current ID1+σ IDX flowing through the current source M5. The output node voltage $V_{OUT}$ may be determined by an output node current (IOUT=(ID2−ID1)−σ IDX)), which is obtained by subtracting the current ID1+σ IDX flowing through the current source M5 from the current ID2 supplied to the second monitoring transistor M2. Accordingly, the MDCC 300 may vary the recovery current σ IDX of the current source M5 and correct a threshold voltage ($V_{TH}$) mismatch between the first and second monitoring transistors M1 and M2.

Figure 5:
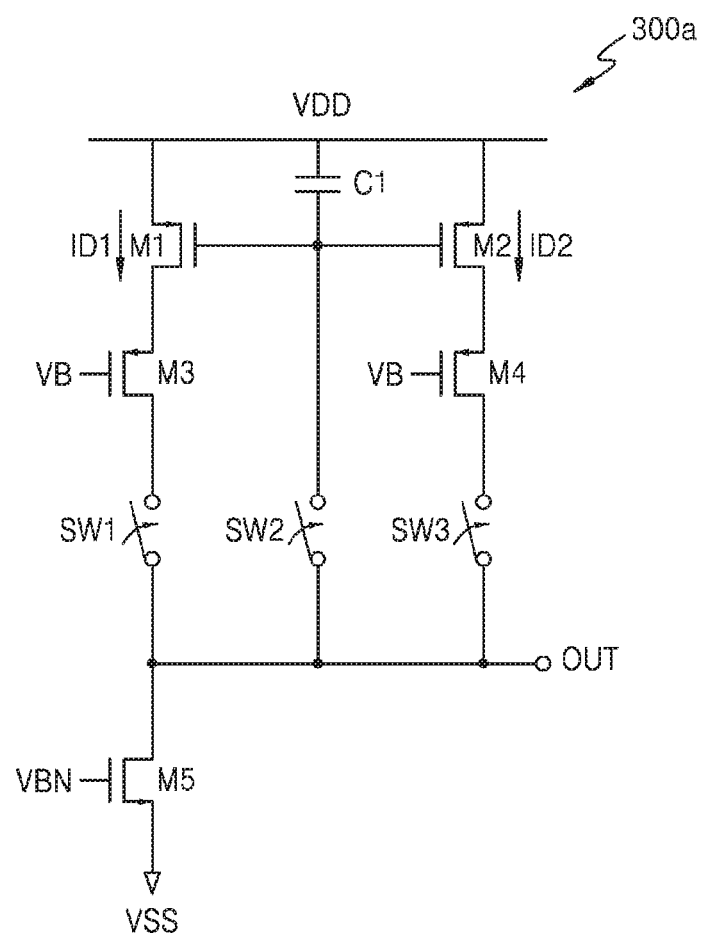
FIG. 5 is a circuit diagram of a second example of an MDCC according to an exemplary embodiment of the inventive concept.

FIG. 5 is a circuit diagram of an MDCC 300a according to exemplary embodiments of the inventive concept.

Referring to FIG. 5, the MDCC 300a may be substantially the same as the MDCC 300 of FIG. 3 except that a third monitoring transistor M3 is connected between a first monitoring transistor M1 and a first switch SW1, and a fourth monitoring transistor M4 is connected between a second monitoring transistor M2 and a third switch SW3.

The third and fourth monitoring transistors M3 and M4, each of which includes a PMOS transistor, may have the same size. Gates of the third and fourth monitoring transistors M3 and M4 may be connected in common to a second bias voltage VB. The second bias voltage VB may be applied at a voltage level sufficient to turn on the third and fourth monitoring transistors M3 and M4. Thus, the MDCC 300 may perform an operation of detecting and correcting a threshold voltage ($V_{TH}$) mismatch of the transistor, which is described with reference to FIGS. 4A to 4D.

The MDCC 300a may apply different voltages to the gates of the third and fourth monitoring transistors M3 and M4, compare the first current ID1, which is supplied to the first monitoring transistor M1, with the second current ID2, which is supplied to the second monitoring transistor M2, and detect a source-drain conductance ($G_{DS}$) mismatch of the transistor as a comparison result. The operation of detecting the source-drain conductance ($G_{DS}$) mismatch of the transistor, by using the MDCC 300a will be described in detail with reference to FIGS. 6A and 6B.

Figure 6A:
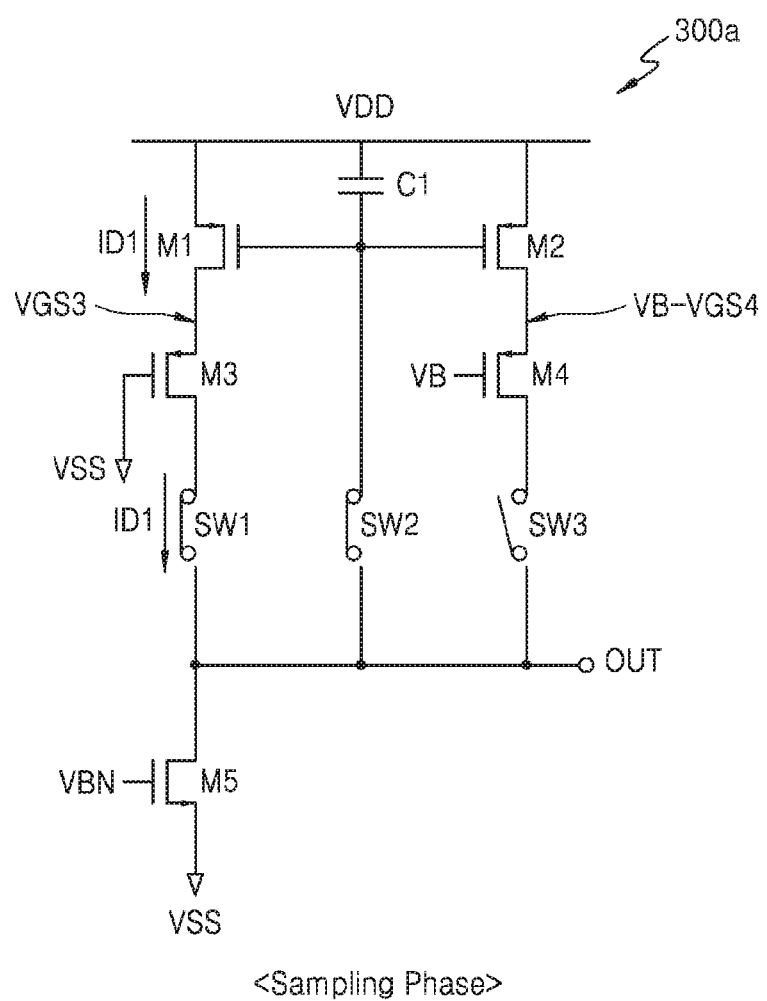
FIGS. 6A and 6B are diagrams of operations of the MDCC of FIG. 5.
Figure 6B:
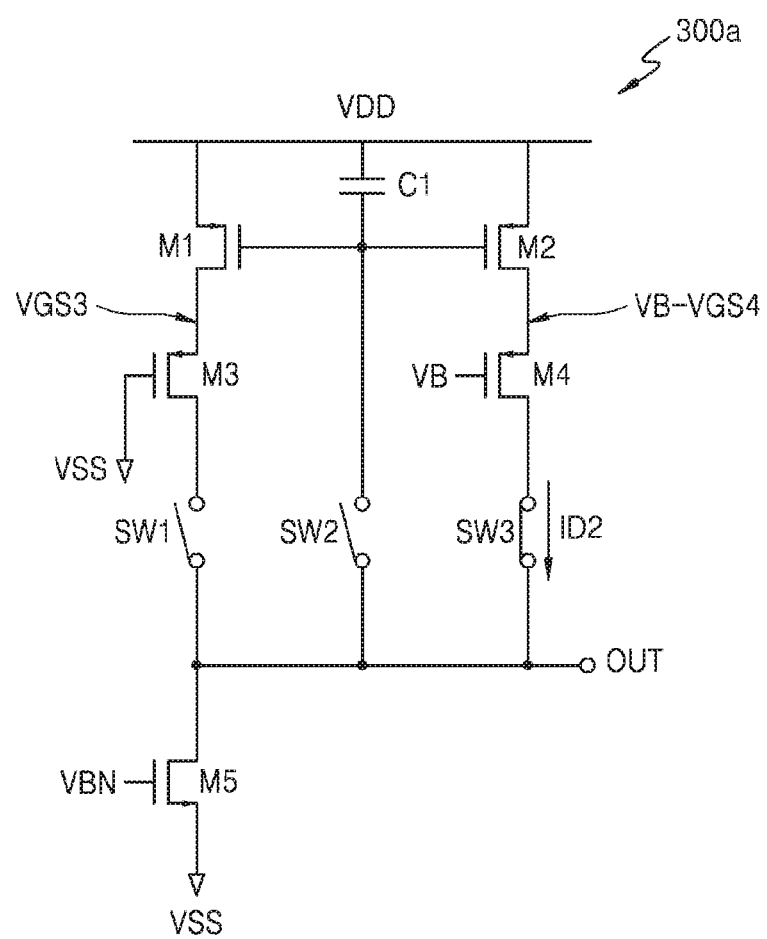

FIGS. 6A and 6B are diagrams of operations of the MDCC 300a of FIG. 5.

Referring to FIG. 6A, in a sampling phase, when a ground voltage VSS is applied to a gate of the third monitoring transistor M3, the first and second switches SW1 and SW2 are turned on, and the third switch SW3 is turned off. A gate and a drain of the first monitoring transistor M1 may be connected. The first current ID1 may be supplied to the first monitoring transistor M1 according to a voltage charged in the sampling capacitor C1 connected to the gate of the first monitoring transistor M1. A drain voltage of the first monitoring transistor M1 may be indicated by a gate-source voltage VGS3 of the third monitoring transistor M3. The first current ID1 may be determined by a voltage difference VDD-VGS3 between the source and the drain of the first monitoring transistor M1. Thus, the first current ID1 may have a current value that is proportional to the difference VDD-VGS3 between the source and the drain of the first monitoring transistor M1.

Referring to FIG. 6B, in a comparison phase, when a second bias voltage VB is applied to a gate of the third monitoring transistor M3, the first and second switches SW1 and SW2 are turned off, and the third switch SW3 is turned on. A second current ID2 may be supplied to the second monitoring transistor M2. A drain voltage of the second monitoring transistor M2 may be indicated by a gate-source voltage VB−VGS4 of the fourth monitoring transistor. The second current ID2 of the second monitoring transistor M2 may be determined by a voltage difference between the source and the drain of the second monitoring transistor M2. Thus, the second current ID2 may have a current value that is proportional to a voltage difference (VDD−(VB−VGS4)) between the source and the drain of the second monitoring transistor M2.

The MDCC 300a may compare the first current ID1, which is proportional to the voltage difference (VDD−VGS3) between the source and the drain of the first monitoring transistor M1, with the second current ID2, which is proportional to the voltage difference (VDD−(VB−VGS4)) between the source and the drain of the second monitoring transistor M2. A difference between the first current ID1 and the second current ID2 may be increased by varying the second bias voltage VB connected to the gate of the fourth monitoring transistor M4.

By varying the second bias voltage VB such that the voltage difference (VDD−(VB−VGS4)) between the source and the drain of the second monitoring transistor M2 is greater than the voltage difference (VDD−VGS3) between the source and the drain of the first monitoring transistor M1, a current difference between the first current ID1 and the second current ID2 may increase. The current difference between the first and second currents ID1 and ID2 may be indicated by a difference in source-drain conductance ($G_{DS}$) between the first and second monitoring transistors M1 and M2. Thus, the MDCC 300a may detect a source-drain conductance ($G_{DS}$) mismatch of a transistor.

The MDCC 300a may adjust current flowing through the current source M5 and detect the current difference between the first and second currents ID1 and ID2. The MDCC 300a may vary a bias voltage VBN and adjust the current flowing through the current source M5. Accordingly, the MDCC 300a may vary the bias voltage VBN of the current source M5 and correct the source-drain conductance ($G_{DS}$) mismatch between the first and second monitoring transistors M1 and M2.

Figure 7A:
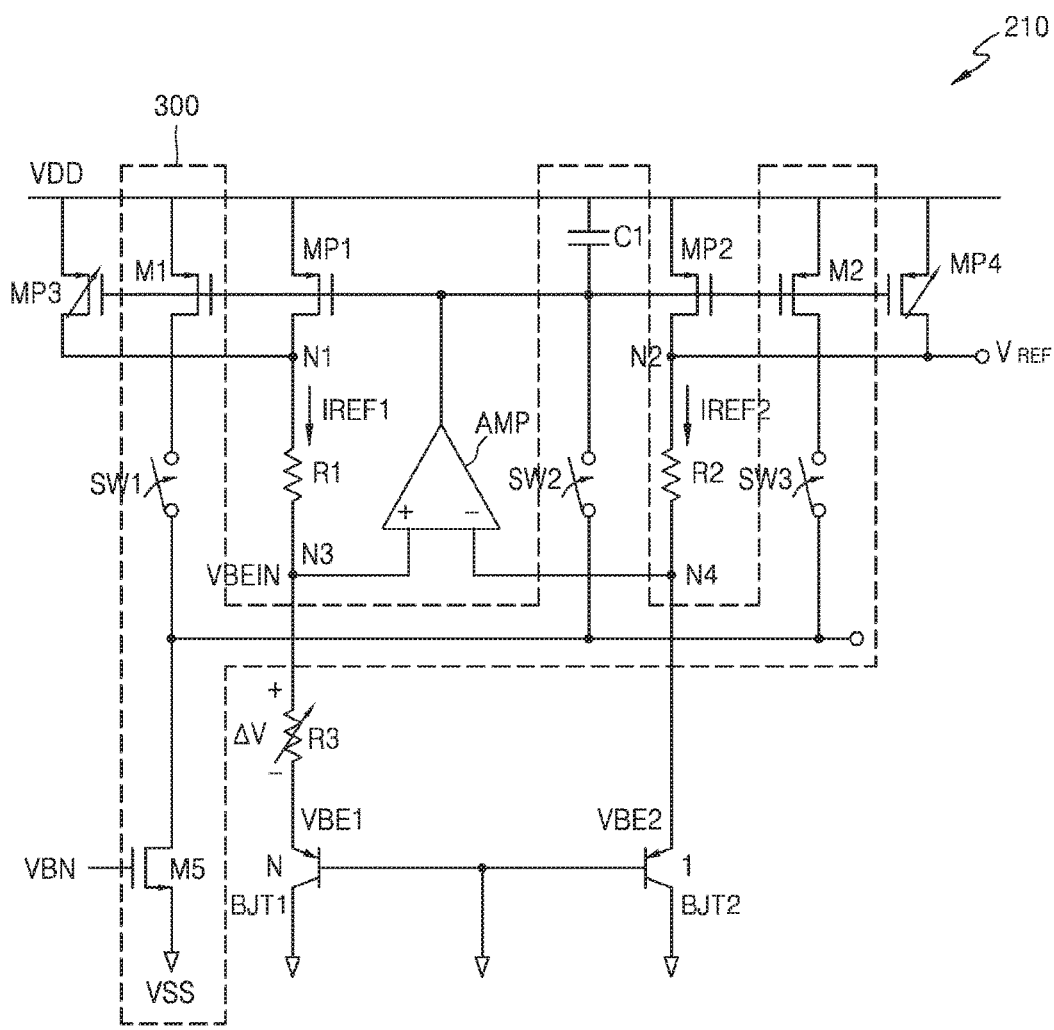
FIGS. 7A to 7C are diagrams of a reference voltage generating circuit and a first MDCC of FIG. 2.
Figure 7B:
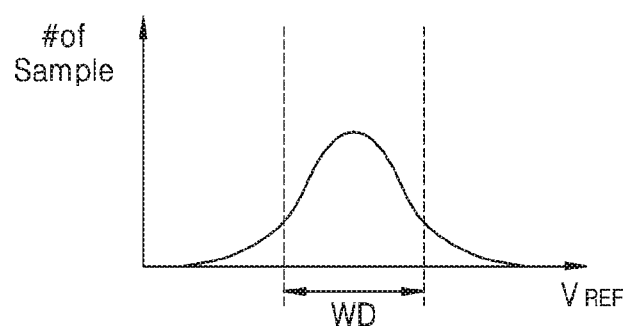
Figure 7C:
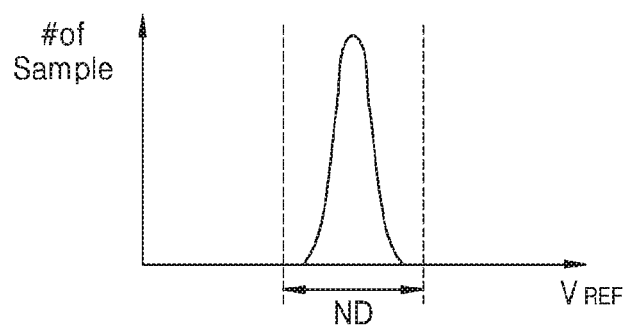

FIGS. 7A to 7C are diagrams of the reference voltage generating circuit 210 and the first MDCC 300 of FIG. 2 according to exemplary embodiments of the inventive concept.

Referring to FIG. 7A, the reference voltage generating circuit 210 may include the first MDCC 300 to detect and correct a threshold voltage ($V_{TH}$) mismatch or source-drain conductance ($G_{DS}$) mismatch of a transistor caused by a process mismatch.

The first MDCC 300 may implemented in the same layout pattern of the reference voltage generating circuit 210 and be affected by peripheral patterns in the same way as the reference voltage generating circuit 210. Thus, the reference voltage generating circuit 210 may generate a constant reference voltage $V_{REF}$ irrespective of temperature in connection with the operation of the first MDCC 300, in other words, the operation of detecting and correcting the threshold voltage ($V_{TH}$) mismatch or the source-drain conductance ($G_{DS}$) mismatch of the transistor.

The reference voltage generating circuit 210 may include first to fourth PMOS transistors MP1, MP2, MP3, and MP4, first and second bipolar junction transistors BJT1 and BJT2, an operational amplifier AMP, and first to third resistors R1, R2, and R3.

The first and third PMOS transistors MP1 and MP3 may be connected between a power supply voltage VDD and a first node N1, and the second and fourth PMOS transistors MP2 and MP4 may be connected between a power supply voltage VDD and a second node N2. The first resistor R1, the third resistor R3, and the first bipolar junction transistor BJT1 may be connected in series between the first node N1 and the ground voltage VSS. A third node N3 may be a connection node between the first resistor R1 and the third resistor R3. The second resistor R2 and the second bipolar junction transistor BJT2 may be connected in series between the second node N2 and the ground voltage VSS. A fourth node N4 may be a connection node between the second resistor R2 and the second bipolar junction transistor BJT2. An output voltage of the second node N2 may be output as a reference voltage $V_{REF}$.

Bases of the first and second bipolar junction transistors BJT1 and BJT2 may be connected in common to the ground voltage VSS. A size of the first bipolar junction transistor BJT1 may be N times a size of the second bipolar junction transistor BJT2. Here, N is a real number larger than 1. The operational amplifier AMP may receive signals of the third node N3 and the fourth node N4 as input signals, and an output node of the operational amplifier AMP may be connected in common to gates of the first to fourth PMOS transistors MP1, MP2, MP3, and MP4.

A base-emitter voltage VBE of a bipolar junction transistor may be inversely proportional to a temperature. The voltage of the fourth node N4 may be a base-emitter voltage VBE2 of the second bipolar junction transistor BJT2. A level of the voltage VBE2 of the fourth node N4 may drop with a rise in temperature. In other words, the voltage VBE2 of the fourth node N4 may be inversely proportional to temperature.

A level of a base-emitter voltage VBE1 of the first bipolar junction transistor BJT1 may also drop with a rise in temperature. Since the size of the first bipolar junction transistor BJT1 is N times larger than that of the second bipolar junction transistor BJT2, the base-emitter voltage VBE1 of the first bipolar junction transistor BJT1 may be larger than a variation in the base-emitter voltage VBE2 of the second bipolar junction transistor BJT2 with respect to temperature.

Since both input signals of the operational amplifier AMP are substantially the same, a voltage VBE1N of the third node N3 may be substantially equal to a voltage VBE2 of the fourth node N4. Accordingly, a level of the voltage VBE1N of the third node N3 may drop with a rise in temperature. In other words, the level of the voltage VBE1N of the third node N3 may be inversely proportional to a temperature.

A variation in the voltage VBE1N of the third node N3 with respect to a temperature may be smaller than a variation in the base-emitter voltage VBE1 of the first bipolar junction transistor BJT1 with respect to a temperature. In this case, a voltage difference ΔV between voltages applied to both ends of the third resistor R3 may increase with a rise in temperature. Accordingly, current supplied to the third resistor R3 may be proportional to temperature.

In the reference voltage generating circuit 210, a first reference current IREF1 supplied to the first resistor R1 through the first and third PMOS transistors MP1 and MP3 may be substantially equal to a second reference current IREF2 supplied to the second resistor R2 through the second and fourth PMOS transistors MP2 and MP4. Thus, the reference voltage generating circuit 210 may generate a constant reference voltage $V_{REF}$ irrespective of temperature.

When the threshold voltage ($V_{TH}$) mismatch or the source-drain conductance ($G_{DS}$) mismatch of a transistor occurs due to a process mismatch the first reference current IREF1 may be different from the second reference current IREF2. This difference may result in the reference voltage generating circuit 210 generating a varied reference voltage $V_{REF}$ that has a wide distribution WD as shown in FIG. 7B.

The reference voltage generating circuit 210 may detect a threshold voltage ($V_{TH}$) mismatch or a source-drain conductance ($G_{DS}$) mismatch of a transistor by using the embedded MDCC 300 so that the first reference current IREF1 can be equal to the second reference current IREF2.

The reference voltage generating circuit 210 may vary currents of the second and fourth PMOS transistors MP2 and MP4 based on the detected mismatch result and correct the threshold voltage ($V_{TH}$) mismatch or the source-drain conductance ($G_{DS}$) mismatch. Thus, the reference voltage generating circuit 210 may generate a reference voltage $V_{REF}$ having a narrow distribution ND as shown in FIG. 7C.

Figure 8A:
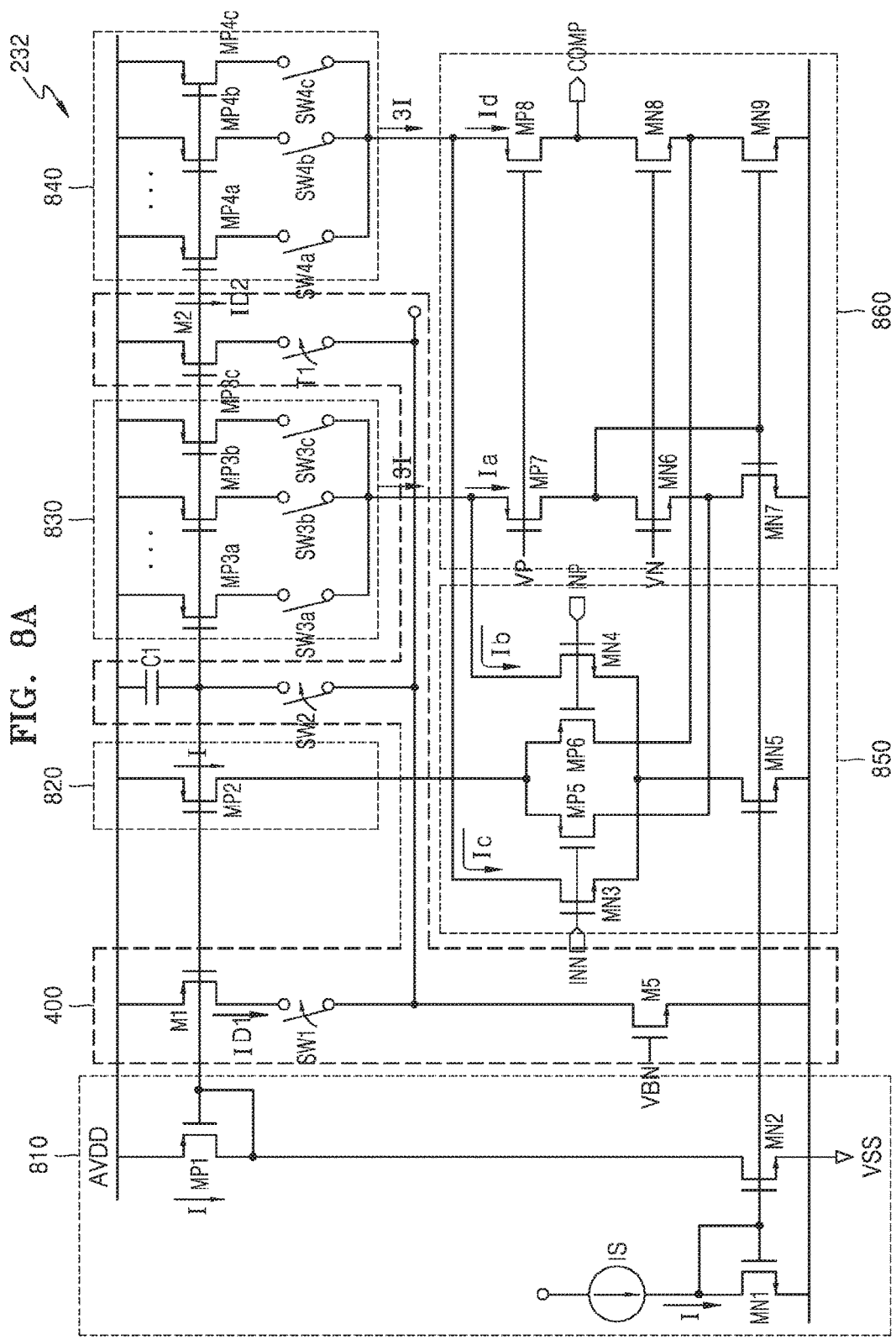
FIGS. 8A to 8C are diagrams of the comparator of the ADC and a second MDCC of FIG. 2.
Figure 8B:
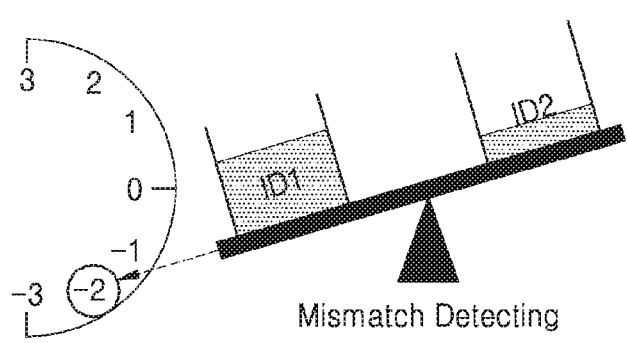
Figure 8C:
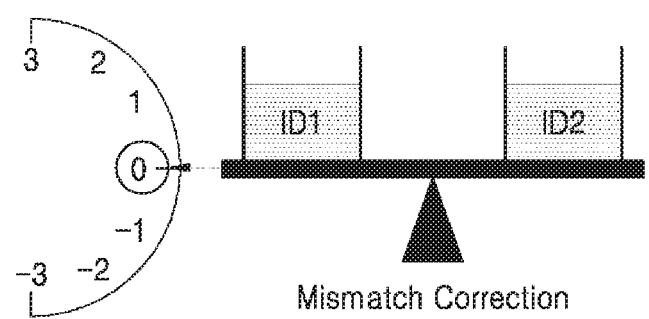

FIGS. 8A to 8C are diagrams of the comparator 232 of the ADC 230 and a second MDCC 400 of FIG. 2 according to an exemplary embodiment of the inventive concept.

Referring to FIG. 8A, the comparator 232 of the ADC (refer 230 in FIG. 2) may include the second MDCC 400 to detect and correct a transistor threshold voltage ($V_{TH}$) mismatch or a source-drain conductance ($G_{DS}$) mismatch caused by a process mismatch.

The second MDCC 400 may be implemented in the same layout pattern as the comparator 232 and be affected by peripheral patterns in the same way as the comparator 232. The comparator 232 may stably perform a comparison operation in connection with the operation of the second MDCC 400. The operation of the second MDCC 400 may detect and correct the threshold voltage ($V_{TH}$) mismatch or the source-drain conductance ($G_{DS}$) mismatch of the transistor.

The comparator 232 may include a reference current generator 810, a first current supply unit 820, a second current supply unit 830, a third current supply unit 840, a comparison unit 850, and a comparison signal generating unit 860.

The reference current generator 810 may include a current source IS, first and second NMOS transistors MN1 and MN2, and a first PMOS transistor MP1. The reference current generator 810 may be designed such that a reference current I flows through the first PMOS transistor MP1 and is mirrored from a current mirror including the first and second NMOS transistors MN1 and MN2 connected to the current source IS.

The first current supply unit 820 may include a second PMOS transistor MP2. The second current supply unit 820 may be designed such that the reference current I flows into the second PMOS transistor MP2 that is included in the current mirror along with the first PMOS transistor MP1.

The second current supply unit 830 may include three PMOS transistors MP3*a* to MP3*c*. The second current supply unit 830 may output a current 3I corresponding to three times the reference current I that flows through the three PMOS transistors MP3*a* to MP3*c*. The second current supply unit 830 may form a current mirror along with the first PMOS transistor MP1, and switches SW3*a* to SW3*c*, which are selectively turned on.

The third current supply unit 840 may include three PMOS transistors MP4*a* to MP4*c*. The third current supply unit 840 may output a current 3I corresponding to three times the reference current I that flows through the three PMOS transistors MP4*a* to MP4*c*. The third current supply unit 840 may form a current mirror along with the first PMOS transistor MP1, and switches SW4*a* to SW4*c*, which are selectively turned on.

The comparison unit 850 may include a fifth PMOS transistor MP5 and a third NMOS transistor MN3 configured to receive a first input INN. A sixth PMOS transistor MP6 and a fourth NMOS transistor MN4 configured to receive a second input INP. A fifth NMOS transistor MN5 connected between the third and fourth NMOS transistors MN3 and MN4 and a ground voltage VSS.

The fifth and sixth PMOS transistors MP5 and MP6 may be connected to the first current supply unit 820, the third NMOS transistor MN3 may be connected to the third current supply unit 840, and the fourth NMOS transistor MN4 may be connected to the second current supply unit 830. The fifth NMOS transistor MN5 may constitute a current mirror along with the first and second NMOS transistors MN1 and MN2 of the reference current generator 810.

The comparison signal generating unit 860 may include a seventh PMOS transistor MP7 and sixth and seventh NMOS transistors MN6 and MN7, which are connected in series between a connection node between the third NMOS transistor MN3 and the second current supply unit 830 and the ground voltage VSS. The comparison signal generating unit 860 may also include an eighth PMOS transistor MP8 and eighth and ninth NMOS transistors MN8 and MN9, which are connected in series between a connection node between the fourth NMOS transistor MN4 and the third current supply unit 840 and the ground voltage VSS.

The seventh and eighth PMOS transistors MP7 and MP8 and the sixth and eighth NMOS transistors MN6 and MN8 may be controlled by bias voltages VP and VN. The seventh and ninth NMOS transistors MN7 and MN9 may constitute a current mirror along with the first and second NMOS transistors MN1 and MN2 of the reference current generator 810. An output signal of a connection node between the eighth PMOS transistor MP8 and the eighth NMOS transistor MN8 may be output as a comparison signal COMP.

The sum of current Ib supplied to the fourth NMOS transistor MN4 of the comparison unit 850 and current Ia supplied to the seventh PMOS transistor MP7 of the comparison signal generating unit 860 may be the current 3I of the third current supply unit 830. In addition, the sum of current Ic supplied to the third NMOS transistor MN3 of the comparison unit 850 and current Id supplied to the eighth PMOS transistor MP8 of the comparison signal generating unit 860 may be current 3I of the fourth current supply unit 840. It will be assumed that each of the current Ia and the current Ic is designed to be equivalent to the current 2I and each of the current Ib and the current Id is designed to be equivalent to current I.

When a threshold voltage ($V_{TH}$) mismatch or a source-drain conductance ($G_{DS}$) mismatch of the transistor occurs due to a process mismatch, the current 2I, which is smaller than the designed current 3I, may flow through the third and fourth current supply units 830 and 840. In this case, when the current 2I of the third and fourth current supply units 830 and 840 is supplied only as the current Ia and the current Ic of the comparison unit 850 and the comparison signal generating unit 860, the current Ib and the current Id may not flow into the comparison unit 850 and the comparison signal generating unit 860 so that the comparison signal generating unit 860 may not generate a comparison signal COMP.

The comparator 232 may detect a threshold voltage ($V_{TH}$) mismatch or a source-drain conductance ($G_{DS}$) mismatch of a transistor by using the MDCC 400 embedded in the comparator 232 so that current flowing through the third and fourth current supply units 830 and 840 may be controlled to be the designed current 3I.

As shown in FIG. 8B, the MDCC 400 may detect a current difference between a first current ID1 of the first monitoring transistor M1 and a second current ID2 of the second monitoring transistor M2. The scale in FIG. 8B may represent the current different between the first current ID1 and the second current ID2. As shown in FIG. 8C, the MDCC 400 may correct a mismatch such that the first current ID1 is equal to the second current ID2. The scale in FIG. 8C may represent the current different between the first current ID1 and the second current ID2.

The comparator 232 may selectively turn on the switches SW3a to SW3c and SW4a to SW4c based on conditions for correcting the mismatch detected by the MDCC 400. Thus, the comparator 232 may vary currents of the third and fourth current supply units 830 and 840 and stably generate a comparison signal COMP.

Figure 9:
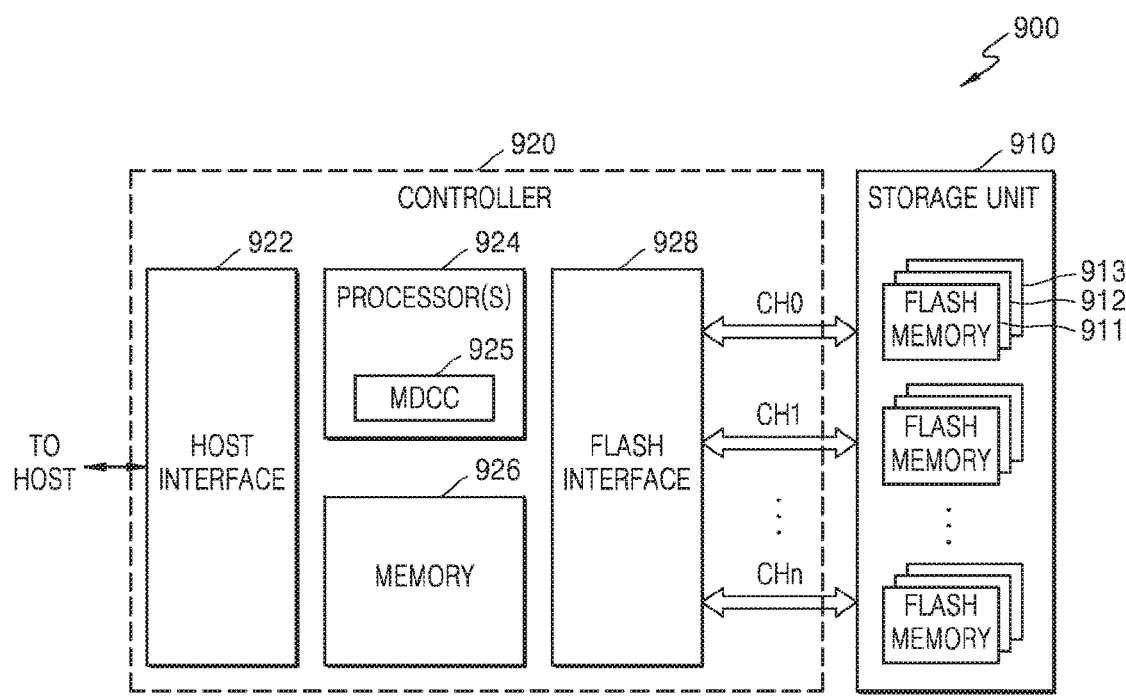
FIG. 9 is a diagram of a storage device including an MDCC according to an exemplary embodiment of the inventive concept.

FIG. 9 is a diagram of a storage device 900 including an MDCC according to an exemplary embodiment of the inventive concept.

Referring to FIG. 9, the storage device 900 may be configured as a solid-state drive (SSD) or a similar flash-based storage system. The storage device 900 may include a data storage unit 910 and a controller 920. Hereinafter, the storage device 900 will be referred to as an SSD. The data storage unit 910 may be configured as a non-volatile memory, such as a flash memory.

The controller 920 may include a host interface 922, a processor 924, a memory 926, and a flash interface 928. The processor 924 may include an MDCC 925. In some embodiments, the MDCC 925 may be included in the host interface 922, the memory 926, or the flash interface 928.

For example, N channels may be formed between the data storage unit 910 and the controller 920, where N is a real number between greater than or equal to one. A plurality of flash memories 911 to 913 may be electrically connected to each of channels $CH_0$ to $CH_{(N-1)}$. In an embodiment of the inventive concept, same-type memories may be connected to one of the plurality of channels $CH_0$-$CH_{(N-1)}$, and different-type memories and same-type memories may be connected to the other channels.

The host interface 922 may serve to interface exchange of data between the host and the storage device 900, which are connected via a high-speed bus. The host may be a mobile device 100 of FIG. 1. A bus format of the host interface 922 may include a universal serial bus (USB), a small computer system interface (SCSI), peripheral component interface-express (PCIe), advanced technology attachment (ATA), parallel-ATA (PATA), serial-ATA (SATA), or serial attached SCSI (SAS). The host interface 922 may receive a control command or data from the host. Also, the host interface 922 may transmit the control command or data output by the host to the processor 924 via an internal bus.

The processor 924 may control the overall operation of the SSD 900. The processor 924 may control exchange of data between the host and the host interface 922. The processor 924 may generally control the SSD 900 to perform an operation in response to the control command output by the host. The processor 924 may receive a control command or data from the host via the internal bus. The processor 924 may control the SSD 900 to store data corresponding to the control command in the memory 926 or the flash memories 911 to 913.

The processor 924 may detect a threshold voltage ($V_{TH}$) mismatch or a source-drain conductance ($G_{DS}$) mismatch of the transistor and compensate an error caused by the mismatch by using the MDCC 925. Thus, even if a process mismatch caused by a process variation occurs, the processor 924 may stably control an operation of the SSD 900.

The memory 926 may be provided as a temporary storage space of the processor 924 and store various pieces of data for an operation of an SSD control program executed by the processor 924. The memory 926 may include a non-volatile memory (e.g., a boot read only memory (ROM)) capable of storing a program code for controlling an operation of the processor 924. In addition, the memory 926 may include a volatile memory (e.g., DRAM or SRAM) capable of storing data transmitted and received between the host and the processor 924. Here, the DRAM may be used as a cache memory or a write buffer memory.

The memory 926 may serve as a buffer memory configured to store write data provided from the host or data read from the flash memories 911 to 213. When the memory 926 receives a read request from the host and data of the flash memories 911 to 913 is cached in the memory 926, the memory 926 may serve a cache function to directly provide the cached data to the host. In general, a data transmission rate of a bus format (e.g., SATA or SAS) of the host may be much higher than a transmission rate of a memory channel of the SSD 900. For example, when the host has a much high interface speed, the memory 926 may provide a buffer memory space and minimize performance degradation caused by a difference in speed.

Figure 10:
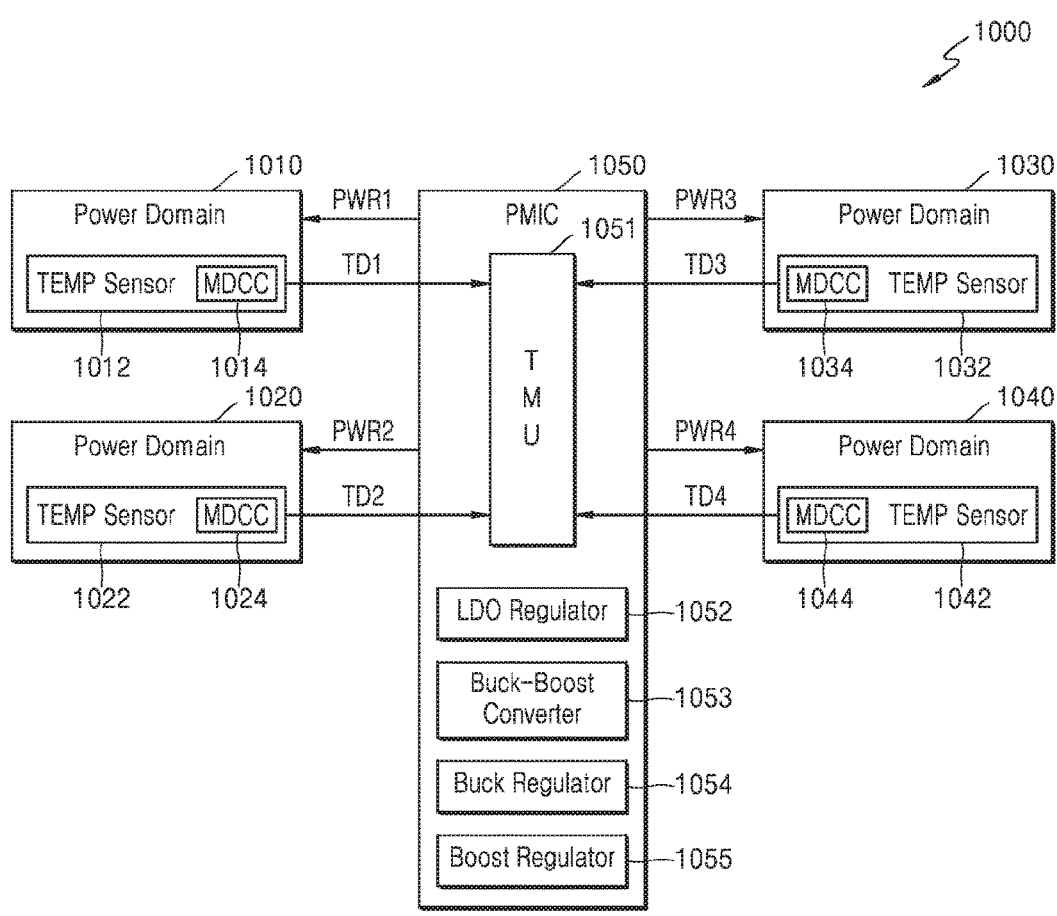
FIG. 10 is a diagram of a power management integrated circuit (PMIC) connected to a temperature sensor including an MDCC according to an exemplary embodiment of the inventive concept.

FIG. 10 is a diagram of a power management integrated circuit (PMIC) 1050 connected to a temperature sensor including an MDCC according to an exemplary embodiment of the inventive concept.

Referring to FIG. 10, the PMIC 1050 may be provided to stably supply power to an electronic device 1000. The PMIC 1050 may generate different operating powers PWR1, PWR2, PWR3, and PWR4 and supply the operating powers PWR1 to PWR4 to power domain blocks 1010, 1020, 1030, and 1040 configured to operate with the different operating powers PWR1 to PWR4.

The power domain blocks 1010, 1020, 1030, and 1040 may respectively include temperature sensors 1012, 1022, 1032, and 1042 in which MDCCs 1014, 1024, 1034, and 1044 are respectively embedded. The temperature sensors 1012, 1022, 1032, and 1042 may sense temperatures of the power domain blocks 1010, 1020, 1030, and 1040 correspondingly respectively thereto and provide temperature information TD1, TD2, TD3, and TD4 as output signals.

When a process mismatch caused by a process variation occurs, each of the temperature sensors 1012, 1022, 1032, and 1042 may detect a threshold voltage ($V_{TH}$) mismatch or a source-drain conductance ($G_{DS}$) mismatch of a transistor by using the MDCCs 1014, 1024, 1034, and 1044. The MDCCs 1014, 1024, 1034, and 1044 may compensate for an error caused by the mismatch in the temperature sensors 1012, 1022, 1032, and 1042. Thus, the temperature sensors 1012, 1022, 1032, and 1042 may stably provide the temperature information TD1, TD2, TD3, and TD4.

The PMIC 1050 may include a temperature management unit 1051, a low-dropout (LDO) regulator 1052, a buck-boost converter 1053, a buck regulator 1054, and a boost regulator 1055.

The temperature management unit 1051 may execute an interrupt service routine for analyzing a distribution of temperatures of the electronic device 1000 and taking appropriate measures based on temperature information TD1, TD2, TD3, and TD4 provided by the temperature sensors 1012, 1022, 1032, and 1042.

The LDO regulator 1052 may be a linear voltage regulator configured to operate at a very low I/O differential voltage. The LDO regulator 1052 may regulate an output voltage of the buck-boost converter 1053 and output operating voltages PWR1 to PWR4. LDO regulators 1052 may be provided in an equal number to the number of operating voltages PWR1 to PWR4 of the power domain blocks 1010 to 1040.

The buck-boost converter 1053 may monitor a main power supply voltage VDD. The buck-boost converter 1053 may operate in a buck mode when the main power supply voltage VDD is higher than a set output voltage of the buck-boost converter 1053, and operate in a boost mode when the main power supply voltage VDD is lower than the output voltage of the buck-boost converter 1053. Thus, the buck-boost converter 1053 may generate a constant output voltage.

The buck regulator 1054 may serve as a voltage-drop direct-current/direct-current (DC/DC) converter. The buck regulator 1054 may drop an input voltage and generate a set voltage. The buck regulator 1054 may operate by using a switching device configured to be switched on and off at regular periods. Thus, the buck regulator 1054 may be configured to connect an input power to a circuit when a switch is turned on and disconnect the input power from the circuit when the switch is turned off. The buck regulator 1054 may average periodically connected and disconnected pulse-type voltages by using an inductor-capacitor (LC) filter and output a DC voltage. The buck regulator 1054 may average pulse voltages generated by periodically chopping the DC voltage and generating an output voltage. Based on the above description, the output voltage of the buck regulator 1054 may be lower than an input voltage (e.g., the main power supply voltage VDD) of the buck regulator 1054.

The boost regulator 1055 may be a voltage-boost DC/DC converter. When a switch is turned on, the main power supply voltage VDD may be connected to both ends of an inductor so that the boost regulator 1055 may be charged with current. When the switch is turned off, the boost regulator 1055 may transmit the charged current to a load side. Thus, current of an output terminal of the boost regulator 1055 may be smaller than current of an input terminal thereof. Since the boost regulator 1055 operates on such that there is no loss element, an output voltage of the boost regulator 1055 may be higher than an input voltage thereof based on the following relationship: input current*input voltage=output current*output voltage.

Figure 11:
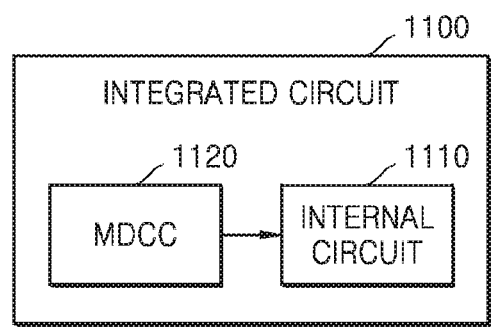
FIG. 11 is a block diagram of an IC including an MDCC according to an exemplary embodiments of the inventive concept.

FIG. 11 is a block diagram of an IC 1100 including an MDCC according to an exemplary embodiment of the inventive concept.

Referring to FIG. 11, the IC 1100 may include an internal circuit 1110 and an MDCC 1120.

The internal circuit 1110 may perform an operation of the IC 1100. When a process mismatch caused by a process variation of the IC 1100 occurs, the MDCC 1120 may detect a threshold voltage (VTH) mismatch or source-drain conductance (GDS) mismatch of a transistor and correct an error caused by the mismatch for the internal circuit 1110. Thus, even if the process mismatch occurs, the internal circuit 1110 may stably perform an operation.

Figure 12:
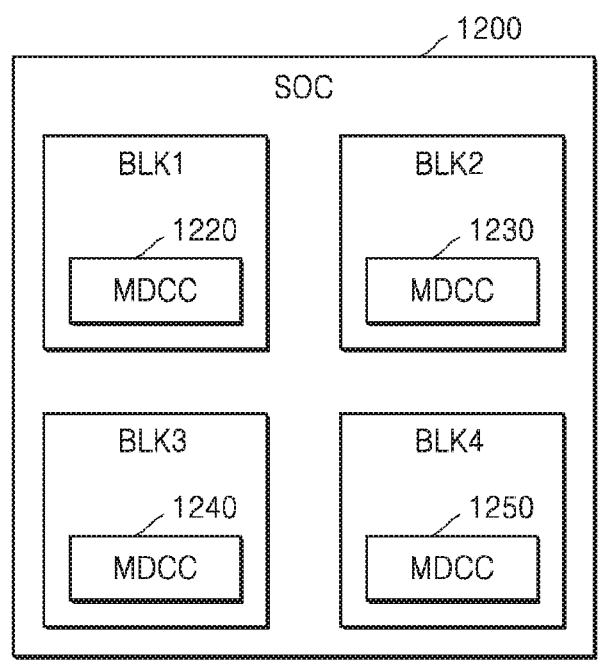
FIG. 12 is a block diagram of a system-on chip (SoC) including an MDCC according to an exemplary embodiment of the inventive concept.

FIG. 12 is a block diagram of a system-on chip (SoC) 1200 including an MDCC according to an exemplary embodiment of the inventive concept.

Referring to FIG. 12, the SoC 1200 may include a plurality of blocks BLK1, BLK2, BLK3, and BLK4, which may be classified from one another according to respective intrinsic functions. Each of the blocks BLK1, BLK2, BLK3, and BLK4 may be one of a core block, a display control block, a file system block, a graphic processing unit (GPU) block, an image signal processing block, and a multi-format codec block, which may include a processor and a memory controller.

In an embodiment of the inventive concept, the SoC 1200 may be an application processor (AP), a microprocessor (MP), a central processing unit (CPU), an application-specific IC (ASIC), a mobile SoC, a multimedia SoC, or an apparatus or system similar thereto.

The blocks BLK1, BLK2, BLK3, and BLK4 may include MDCCs 1220, 1230, 1240, and 1250, respectively. When a process mismatch caused by a process variation of the SoC 1200 occurs, each of the MDCCs 1220, 1230, 1240, and 1250 may detect a threshold voltage ($V_{TH}$) mismatch or a source-drain conductance ($G_{DS}$) mismatch of a transistor in one of the blocks BLK1, BLK2, BLK3, and BLK4 and correct an error in the block caused by the mismatch. Thus, even if the process mismatch occurs, the blocks BLK1, BLK2, BLK3, and BLK4 of the SoC 1200 may stably perform intrinsic functions.

Figure 13:
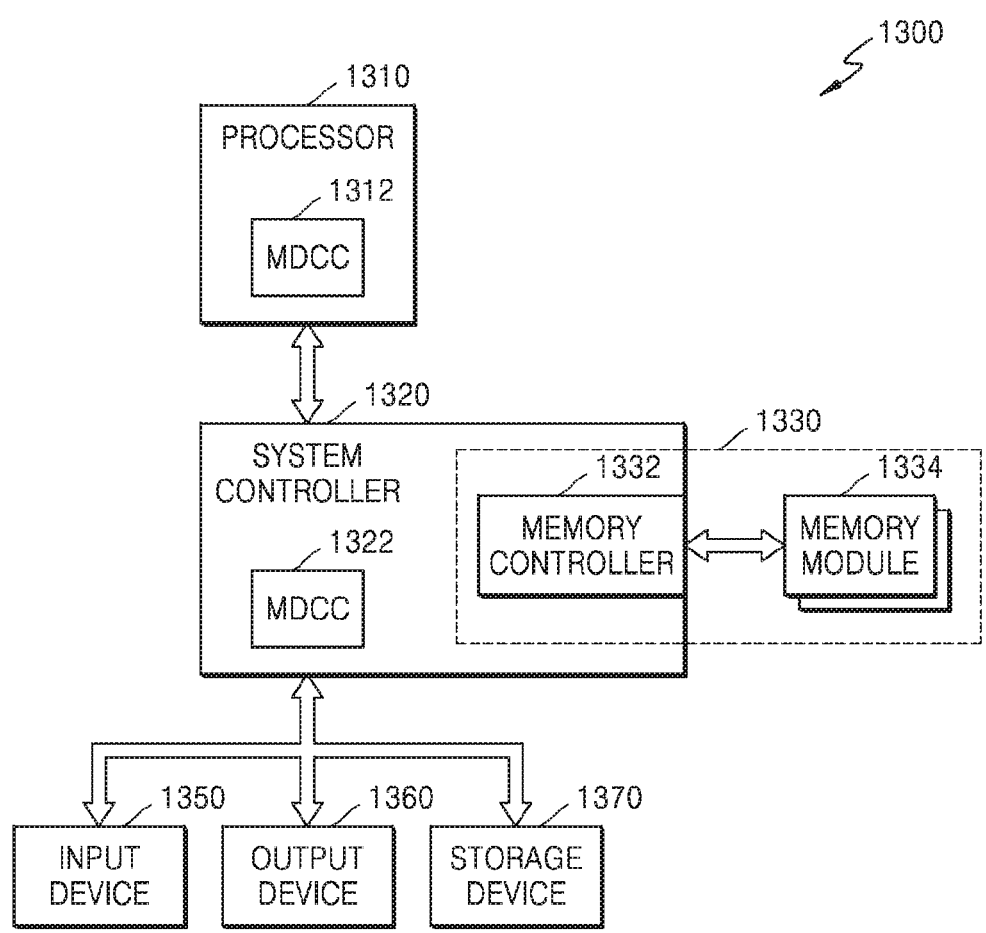
FIG. 13 is a block diagram of a memory system including an MDCC according to an exemplary embodiment of the inventive concept.

FIG. 13 is a block diagram of a memory system 1300 including an MDCC according to exemplary embodiments of the inventive concept.

Referring to FIG. 13, the memory system 1300 may include a processor 1310, a system controller 1320, and a memory device 1330. The memory system 1300 may further include an input device 1350, an output device 1360, and a storage device 1370.

The memory device 1330 may include a plurality of memory modules 1334 and a memory controller 1332 configured to control the memory modules 1334. The memory modules 1334 may include at least one volatile memory or non-volatile memory, and the memory controller 1332 may be included in the system controller 1320.

The processor 1310 may perform calculations or tasks. The processor 1310 may be connected to the system controller 1320 via a processor bus. The system controller 1320 may be connected to the input device 1350, the output device 1360, and the storage device 1370 via an expansion bus. Thus, the processor 1310 may control the input device 1350, the output device 1360, and the storage device 1370 via the system controller 1320.

The processor 1310 and the system controller 1320 may include MDCCs 1312 and 1322, respectively. When a process mismatch caused by a process variation occurs, each of the MDCCs 1312 and 1322 may detect a threshold voltage ($V_{TH}$) mismatch or a source-drain conductance ($G_{DS}$) mismatch of a transistor and correct errors in the processor 1310 and the system controller 1320 caused by the mismatch. Thus, even if a process mismatch occurs, the processor 1310 and the system controller 1320 of the memory system 1300 may stably perform calculations or tasks.

Figure 14:
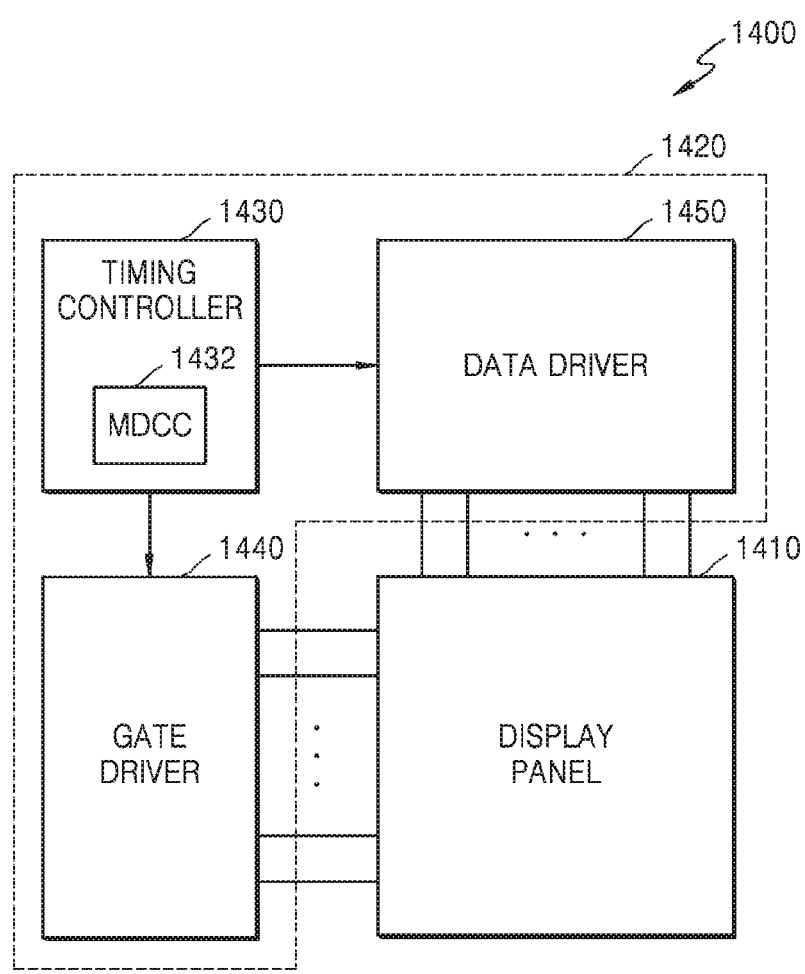
FIG. 14 is a block diagram of a display system including an MDCC according to an exemplary embodiment of the inventive concept.

FIG. 14 is a block diagram of a display system 1400 including an MDCC according to an exemplary embodiment of the inventive concept.

Referring to FIG. 14, the display system 1400 may include a display panel 1410 and a display driver integrated circuit (DDI) 1420.

The display panel 1410 may include a plurality of gate lines and a plurality of data lines. The display panel 1410 may include a plurality of pixels disposed at intersections between the respective gate lines and the data lines. The plurality of pixels may be arranged in a matrix shape and form a pixel array. The display panel 1410 may include an LCD panel, an LED panel, an OLED panel, or a field emission display (FED) panel.

The DDI 1420 may control an operation of the display panel 1410. The DDI 1420 may include a timing controller 1430, a gate driver 1440, and a data driver 1450.

The timing controller 1430 may generate a gate driver control signal, a data driver control signal, and data based on an image data signal and a system control signal received from an external apparatus, such as a GPU.

The gate driver 1440 may selectively enable gate lines of the display panel 1410 based on the gate driver control signal and select a row of a pixel array.

The data driver 1450 may apply a plurality of driving voltages to the data lines of the display panel 1410 based on the data driver control signal and the data. The display panel 1410 may operate due to operations of the gate driver 1440 and the data driver 1450 and display an image corresponding to the image data signal.

The timing controller 1430 may include an MDCC 1432. When a process mismatch caused by a process variation occurs in the timing controller 1430, the MDCC 1432 may detect a threshold voltage ($V_{TH}$) mismatch or a source-drain conductance ($G_{DS}$) mismatch of a transistor, and correct an error in the timing controller 1430 caused by the mismatch. Thus, even if the process mismatch occurs, the timing controller 1430 of the display system 1400 may stably generate the gate driver control signal, the data driver control signal, and the image data.

Figure 15:
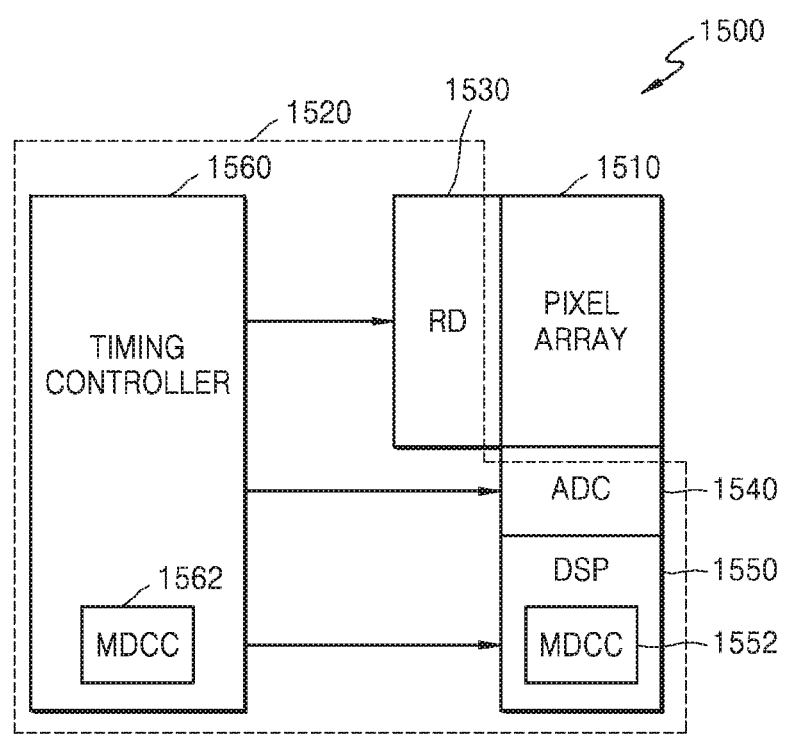
FIG. 15 is a block diagram of an image sensor including an MDCC according to an exemplary embodiment of the inventive concept.

FIG. 15 is a block diagram of an image sensor 1500 including an MDCC according to an exemplary embodiment of the inventive concept.

Referring to FIG. 15, the image sensor 1500 may include a pixel array 1510 and a signal processor 1520.

The pixel array 1510 may convert incident light and generate an electric signal. The pixel array 1510 may include a plurality of unit pixels arranged in a matrix shape. The plurality of unit pixels may include color pixels configured to provide color image information and/or distance pixels configured to provide distance information regarding distances to an object. When the pixel array 1510 includes distance pixels, the image sensor 1500 may further include a light source unit configured to irradiate light to the object.

The signal processor 1520 may process an electric signal and generate image data. The signal processor 1520 may include a row driver (RD) 1530, an analog-to-digital converter (ADC) 1540, a digital signal processor (DSP) 1550, and a timing controller 1560.

The row driver 1530 may be connected to each row of the pixel array 1510 and generate a driving signal for driving each row. The ADC 1540 may be connected to each column of the pixel array 1510 and convert an analog signal output from the pixel array 1510 into a digital signal. In an exemplary embodiment of the inventive concept, the ADC 1540 may include a correlated double sampling (CDS) unit configured to sample a valid signal element. The CDS unit may perform an analog double sampling operation, a digital double sampling operation, or a dual CDS operation for performing both the analog and digital double sampling operations.

The DSP 1550 may receive a digital signal output by the ADC 1540 and perform an image data processing operation on the digital signal. The timing controller 1560 may transmit control signals for controlling the row driver 1530, the ADC 1540, and the DSP 1550.

The DSP 1550 and the timing controller 1560 may include MDCCs 1552 and 1562, respectively. When a process mismatch caused by a process variation occurs in the DSP 1550 and the timing controller 1560, each of the MDCCs 1552 and 1562 may detect a threshold voltage ($V_{TH}$) mismatch or a source-drain conductance ($G_{DS}$) mismatch of a transistor and correct errors in the DSP 1550 and the timing controller 1560 caused by the mismatch. Thus, even if the process mismatch occurs, the DSP 1550 and the timing controller 1560 of the image sensor 1500 may stably perform the image data processing operation.

Figure 16:
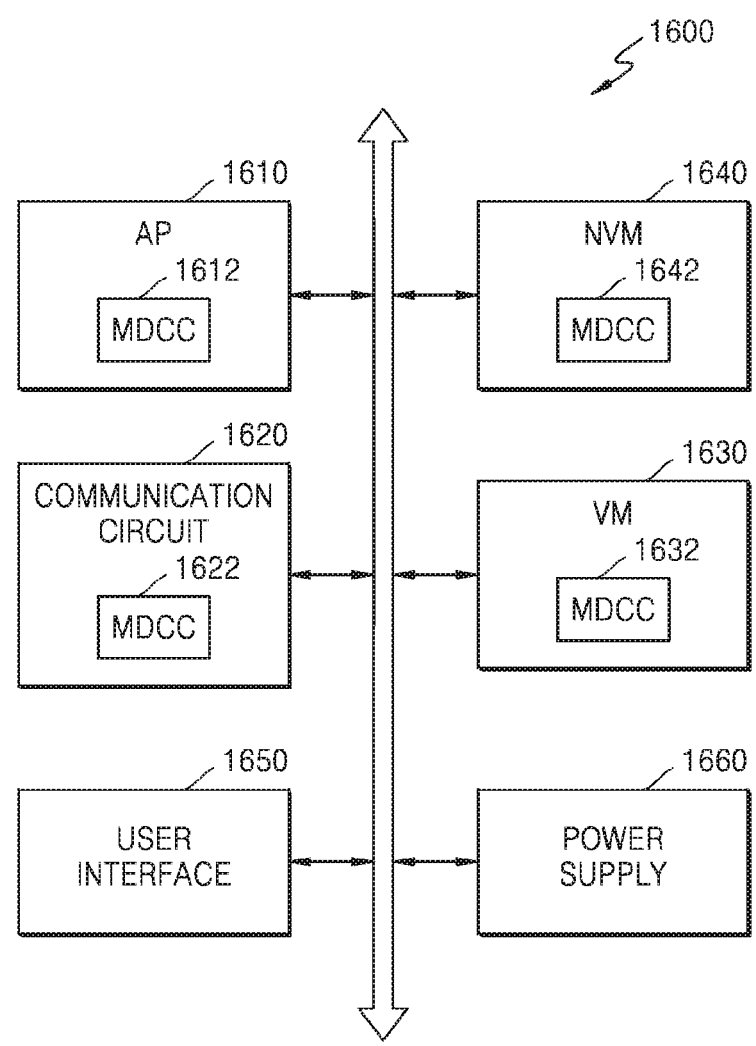
FIG. 16 is a block diagram of an example of applying an MDCC according to an exemplary embodiment to a mobile system.

FIG. 16 is a block diagram of an example of applying an MDCC to a mobile system according to an exemplary embodiment of the inventive concept.

Referring to FIG. 16, the mobile system 1600 may include an application processor (AP) 1610, a communication circuit 1620, a volatile memory device (VM) 1630, a non-volatile memory device (NVM) 1640, a user interface 1650, and a power supply 1660. In some embodiments, the mobile system 1600 may be a mobile system, such as a mobile phone, a smartphone, a personal digital assistant (PDA), a portable multimedia player (PMP), a digital camera, a music player, a portable game console, or a navigation system.

The AP 1610 may execute applications configured to provide Internet browsers, games, and moving images. In an exemplary embodiment of the inventive concept, the AP 1610 may include a single processing core or a multi-core processor. For example, the AP 1610 may include a multi-core processor, such as a dual-core, a quad-core, or a hexa-core. In an exemplary embodiment of the inventive concept, the AP 1610 may further include a cache memory located inside or outside the AP 1610.

The communication circuit 1620 may wirelessly communicate with an external apparatus. For example, the communication circuit 1620 may perform an Ethernet communication operation, a near-field communication (NFC) operation, a radio-frequency identification (RFID) communication operation, a mobile telecommunication operation, a memory card communication operation, and a universal serial bus (USB) communication operation. For example, the communication circuit 1620 may include a baseband chipset and support communications, such as global system for mobile communications (GSM), general packet radio service (GPRS), wideband code division multiple access (WCDMA), and high-speed downlink/uplink packet access (HSxPA).

The volatile memory device 1630 may store data processed by the AP 1610 and operate as a working memory. For example, the volatile memory device 1630 may be embodied by dynamic random access memory (DRAM), static random access memory (SRAM), mobile DRAM, double data rate synchronous dynamic RAM (DDR SDRAM), low-power DDR (LPDDR) SDRAM, graphics DDR (GDDR) SDRAM, Rambus DRAM (RDRAM), or memories similar thereto.

The non-volatile memory device 1640 may store a boot image for booting the mobile system 1600. For example, the non-volatile memory device 1640 may be embodied by electrically erasable programmable read-only memory (EEPROM), flash memory, phase-change RAM (PRAM), resistive RAM (RRAM), nano-floating gate memory (NFGM), polymer RAM (PoRAM), magnetic RAM (MRAM), ferroelectric RAM (FRAM), or memories similar thereto.

The AP 1610, the communication circuit 1620, the volatile memory device 1630, and the non-volatile memory device 1640 may include MDCCs 1612, 1622, 1632, and 1642, respectively. When a process mismatch caused by a process variation occurs in the AP 1610, the communication circuit 1620, the volatile memory device 1630, and the non-volatile memory device 1640, each of the MDCCs 1612, 1622, 1632, and 1642 may detect a threshold voltage ($V_{TH}$) mismatch or a source-drain conductance ($G_{DS}$) mismatch of a transistor and correct an error caused by the mismatch for the AP 1610, the communication circuit 1620, the volatile memory device 1630, and the non-volatile memory device 1640. Thus, even if a process mismatch occurs, the AP 1610, the communication circuit 1620, the volatile memory device 1630, and the non-volatile memory device 1640 of the mobile system 1600 may operate stably.

The user interface 1650 may include at least one input device (e.g., a keypad or a touch screen) and/or at least one output device (e.g., a speaker or a display device). The power supply 1660 may supply an operating voltage to the mobile system 1600.

In some embodiments, the mobile system 1600 may include a camera image processor (CIS) and further include a storage device, such as a memory card, a solid-state drive (SSD), a hard disk drive (HDD), or CD-ROM.

The mobile system 1600 or elements of the mobile system 1600 may be mounted by packages having various shapes. For example, the mobile system 1600 or the elements of the mobile system 1600 may be mounted by using Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat-pack (MQFP) technique, a thin quad flat-pack (TQFP) technique, a small outline (SOIC) technique, a shrink small outline package (SSOP) technique, a thin small outline (TSOP) technique, a thin quad flatpack (TQFP) technique, a system-in-package (SIP) technique, a multi-chip package (MCP) technique, a wafer-level fabricated package (WFP) technique, or a wafer-level processed stack package (WSP) technique.

Figure 17:
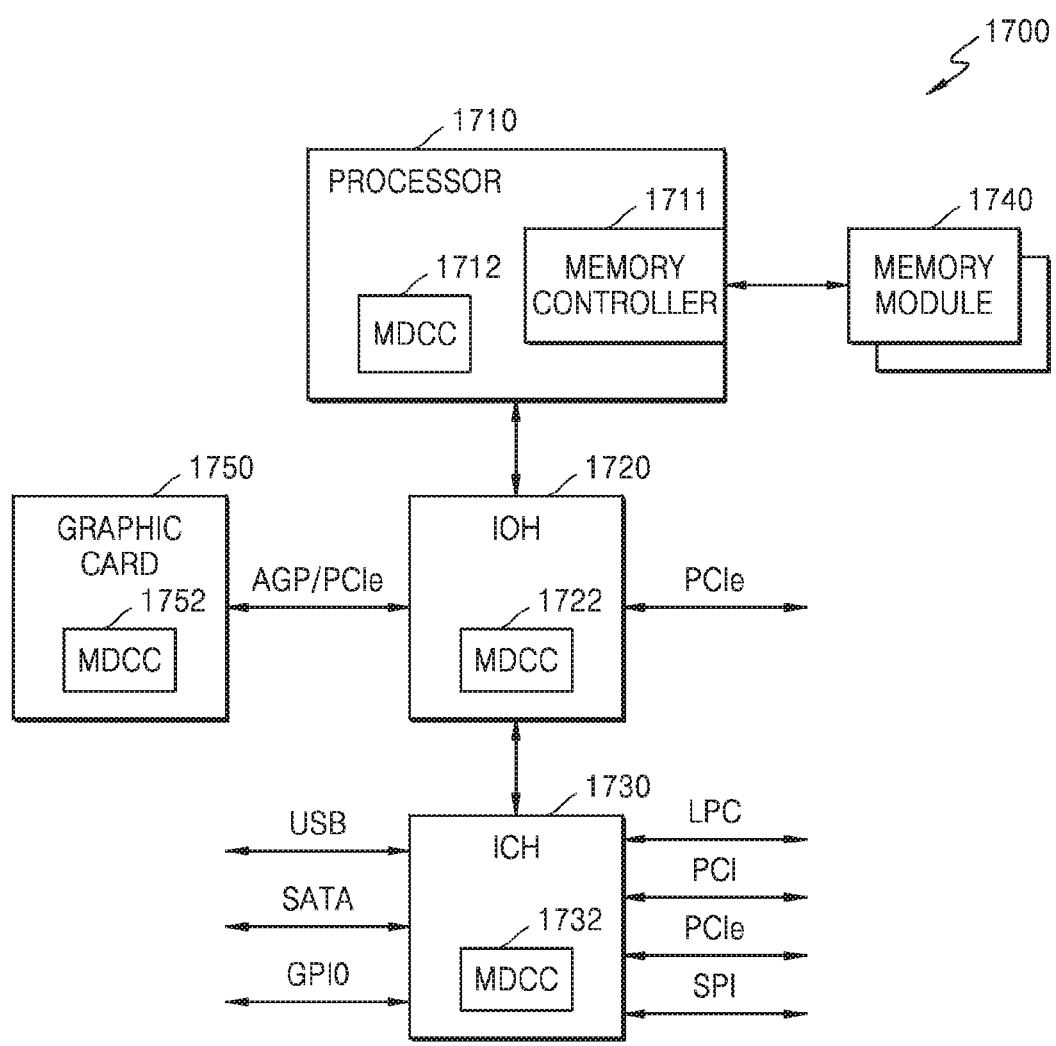
FIG. 17 is a block diagram of an example of applying an MDCC according to an exemplary embodiment to a computing system.

FIG. 17 is a block diagram of an example of applying an MDCC to a computing system 1700 according to an exemplary embodiment of the inventive concept.

Referring to FIG. 17, the computing system 1700 may include a processor 1710, an I/O hub 1720, an I/O controller hub 1730, at least one memory module 1740, and a graphics card 1750. In some embodiments, the computing system 1700 may be a computing system, such as a personal computer (PC), a server computer, a work station, a laptop computer, a mobile phone, a smartphone, a personal digital assistant (PDA), a portable multimedia player (PMP), a digital camera, a camcorder, a digital television (digital TV), a set-top box, a music player, a portable game console, and a navigation system.

The processor 1710 may execute various computing functions, such as calculations or tasks. For example, the processor 1710 may be a microprocessor (MP) or a central processing unit (CPU). In an exemplary embodiment of the inventive concept, the processor 1710 may include a single core or a multi-core. In an exemplary embodiment of the inventive concept, the computing system 1700 may include a plurality of processors. In an exemplary embodiment of the inventive concept, the processor 1710 may further include a cache memory, which is located inside or outside the processor 1710.

The processor 1710 may include a memory controller 1711 configured to control an operation of the memory module 1740. The memory controller 1711 included in the processor 1710 may be referred to as an integrated memory controller (IMC). A memory interface between the memory controller 1711 and the memory module 1740 may be embodied by a single channel including a plurality of signal lines or embodied by a plurality of channels. At least one memory module 1740 may be connected to each channel. In some embodiments, the memory controller 1711 may be located in the I/O hub (IOH) 1720. The I/O hub 1720 including the memory controller 1711 may be referred to as a memory controller hub (MCH). The memory module 1740 may include a plurality of volatile or non-volatile memories configured to store provided by the memory controller 1711.

The I/O hub 1720 may manage transmission of data between devices (e.g., the graphics card 1750) and the processor 1710. The I/O hub 1720 may be connected to the processor 1710 through various interfaces. For example, the I/O hub 1720 and the processor 1710 may be connected by various standard interfaces, such as a front side bus (FSBO, a system bus, HyperTransport (HT), a lightning data transport (LDT), QuickPath Interconnect (QPI), or a common system interface (CSI). In some embodiments, the computing system 1700 may include a plurality of I/O hubs.

The I/O hub 1720 may provide various interfaces with access to devices. For example, the I/O hub 1720 may provide an accelerated graphics port (AGP) interface, a peripheral component interface-express (PCIe), or a communications streaming architecture (CSA) interface.

The graphics card 1750 may be connected to the I/O hub 1720 via an AGP or PCIe. The graphics card 1750 may control a display device to display images. The graphics card 1750 may include an internal processor for processing image data and an internal semiconductor memory device. In some embodiments, the I/O hub 1720 may include a graphics device along with or instead of the graphics card 1750 located outside the I/O hub 1720. The graphics device included in the I/O hub 1720 may be referred to as an integrated graphics. Also, the I/O hub 1720 including a memory controller and the graphics device may be referred to as a graphics and memory controller hub (GMCH).

The I/O controller hub (ICH) 1730 may perform a data buffering operation and an interface arbitration operation such that various system interfaces may efficiently operate. The I/O controller hub 1730 may be connected to the I/O hub 1720 via an internal bus. For example, the I/O hub 1720 and the I/O controller hub 1730 may be connected by a direct media interface (DMI), a hub interface, an enterprise southbridge interface (ESI), or PCIe.

The I/O controller hub 1730 may provide various interfaces with peripheral devices. For example, the I/O controller hub 1730 may provide a USB port, a SATA port, general-purpose I/O (GPIO), a row pin count (LPC) bus, a serial peripheral interface (SPI), a PCI, or a PCIe.

The processor 1710, the I/O hub 1720, the I/O controller hub 1730, and the graphics card 1750 may include MDCCs 1712, 1722, 1732, and 1752, respectively. When a process mismatch caused by a process variation occurs in the processor 1710, the I/O hub 1720, the I/O controller hub 1730, and graphics card 1750, each of the MDCCs 1712, 1722, 1732, 1752 may detect a threshold voltage ($V_{TH}$) mismatch or a source-drain conductance ($G_{DS}$) mismatch of a transistor and correct errors in the processor 1710, the I/O hub 1720, the I/O controller hub 1730, and the graphics card 1750 caused by a mismatch. Thus, even if a process mismatch occurs, the processor 1710, the I/O hub 1720, the I/O controller hub 1730, and graphics card 1750 of the computing system 1700 may stably operate.

In some embodiments, the processor 1710, the I/O hub 1720, and the I/O controller hub 1730 may be embodied by separated chipsets or ICs, respectively. In addition, at least two of the processor 1710, the I/O hub 1720, or the I/O controller hub 1730 may be embodied by a single chipset.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A semiconductor device, comprising:
an integrated circuit (IC) including an internal circuit; and
a mismatch detection and correction circuit connected to the internal circuit of the IC, the mismatch detection and correction circuit configured to detect a process mismatch and correct an error in the internal circuit caused by the process mismatch using a current difference between a first current and a second current based on a charged voltage of a capacitor,
wherein the process mismatch is due to a variation in the manufacture of the internal circuit.

2. The device of claim 1, wherein the mismatch detection and correction circuit detects a threshold voltage mismatch and a source-drain conductance mismatch of a transistor of the IC.

3. The device of claim 1, wherein the mismatch detection and correction circuit comprises:
a first transistor connected between a power supply and a first terminal of a first switch;
the capacitor connected between the power supply and a first terminal of a second switch;
a second transistor connected between the power supply and a first terminal of a third switch; and
a third transistor connected between second terminals of the first, second, and third switches and a ground voltage,
wherein the third transistor is controlled by a bias voltage,
wherein gates of the first and second transistors are connected to a connection node between the capacitor and the second switch.

4. The device of claim 3, wherein when the first and second switches are turned on and the third switch is turned off, the first current is supplied to the first transistor, and
when the first and second switches are turned off and the third switch is turned on, the second current is supplied to the second transistor, and the current difference between the first current and the second current is detected as a threshold voltage mismatch of a transistor of the IC.

5. The device of claim 4, wherein the bias voltage is adjusted such that the first current is equal to the second current, and an error caused by the threshold voltage mismatch of the transistor of the IC is corrected by using a recovery current supplied to the third transistor in response to the adjusted bias voltage.

6. The device of claim 1, wherein the mismatch detection and correction circuit comprises:
a first transistor connected between a power supply and a first node;
a second transistor connected between the power supply and a second node;
a third transistor connected between the first node and a first terminal of a first switch;
the capacitor connected between the power supply and a first terminal of a second switch;
a fourth transistor connected between the second node and a first terminal of a third switch; and
a fifth transistor connected between second terminals of the first, second, and third switches and a ground voltage,
wherein the fifth transistor is controlled by a first bias voltage,
wherein gates of the first and second transistors are connected to a connection node between the capacitor and the second switch, and gates of the third and fourth transistors are connected to second and third bias voltages.

7. The device of claim 6, wherein the second and third bias voltages connected to the gates of the third and fourth transistors are equal to one another,
when the first and second switches are turned on and the third switch is off, the first current is supplied to the first transistor, and
when the first and second switches are turned off and the third switch is turned on, the second current is supplied to the second transistor, and a threshold voltage mismatch of a transistor of the IC is determined by the current difference between the first current and the second current.

8. The device of claim 7, wherein the first bias voltage is adjusted such that the first current is equal to the second current, and an error caused by the threshold voltage mismatch of the transistor of the IC is corrected by using a recovery current added to the fifth transistor in response to the adjusted first bias voltage.

9. The device of claim 6, wherein when the second bias voltage is the ground voltage, the first current is supplied to the first transistor due to a first voltage difference between a source and a drain of the first transistor,
wherein the third bias voltage is different from the second bias voltage, and when the third bias voltage is applied to the fourth transistor, the second current is supplied to the second transistor due to a second voltage difference between a source and a drain of the second transistor, and
the third bias voltage is varied such that the second voltage difference is larger than the first voltage difference, and a source-drain conductance mismatch of the transistor of the IC is determined by the current difference between the first current and the second current.

10. The device of claim 9, wherein the first bias voltage is varied such that the first current is equal to the second current, and an error caused by the source-drain conductance mismatch of the transistor is corrected in response to the adjusted first bias voltage.

* * * * *